United States Patent
Jinta et al.

(10) Patent No.: US 9,219,087 B2
(45) Date of Patent: Dec. 22, 2015

(54) DISPLAY, DISPLAY DRIVE METHOD, METHOD OF MANUFACTURING DISPLAY, AND ELECTRONIC APPARATUS

(71) Applicant: Sony Corporation, Tokyo (JP)

(72) Inventors: Seiichiro Jinta, Kanagawa (JP); Tadahiko Yoshinaga, Kanagawa (JP)

(73) Assignee: Joled Inc., Tokyo (JP)

( * ) Notice: Subject to any disclaimer, the term of this patent is extended or adjusted under 35 U.S.C. 154(b) by 50 days.

(21) Appl. No.: 14/186,125

(22) Filed: Feb. 21, 2014

(65) Prior Publication Data

US 2014/0247200 A1 Sep. 4, 2014

(30) Foreign Application Priority Data

Mar. 4, 2013 (JP) ................. 2013-041574

(51) Int. Cl.
*H01L 27/12* (2006.01)
*G09G 3/32* (2006.01)
*H01L 25/04* (2014.01)
*H01L 27/32* (2006.01)

(52) U.S. Cl.
CPC .......... *H01L 27/1259* (2013.01); *G09G 3/3225* (2013.01); *H01L 25/048* (2013.01); *H01L 27/322* (2013.01); *H01L 27/3209* (2013.01); *H01L 27/3213* (2013.01); *H01L 27/3244* (2013.01); *G09G 2300/0452* (2013.01); *H01L 27/1225* (2013.01); *H01L 2924/0002* (2013.01)

(58) Field of Classification Search
CPC ............ H01L 27/3213; H01L 27/3244; H01L 27/322; H01L 27/3209; H01L 27/1225; H01L 25/048; G09G 3/3225; G09G 2300/0452
See application file for complete search history.

(56) References Cited

U.S. PATENT DOCUMENTS

| 4,843,573 | A | * | 6/1989 | Taylor et al. | 345/591 |
| 2005/0225232 | A1 | * | 10/2005 | Boroson et al. | 313/504 |
| 2006/0231842 | A1 | * | 10/2006 | Hirakata et al. | 257/72 |
| 2007/0228938 | A1 | * | 10/2007 | Hatwar et al. | 313/504 |
| 2011/0037071 | A1 | * | 2/2011 | Ozawa | 257/59 |

FOREIGN PATENT DOCUMENTS

JP 2011-090894 5/2011

* cited by examiner

*Primary Examiner* — Lilana Cerullo
(74) *Attorney, Agent, or Firm* — K&L Gates LLP

(57) ABSTRACT

A display unit includes a plurality of display function layers provided in a stacking direction, and each including a plurality of pixel circuits. A pixel circuit group configured by predetermined number of the pixel circuits configures a single display pixel, and the predetermined number of the pixel circuits spans the plurality of display function layers.

15 Claims, 32 Drawing Sheets

DISPLAY, DISPLAY DRIVE METHOD, METHOD OF MANUFACTURING DISPLAY, AND ELECTRONIC APPARATUS

CROSS REFERENCES TO RELATED APPLICATIONS

The present application claims priority to Japanese Priority Patent Application JP 2013-041574 filed in the Japan Patent Office on Mar. 4, 2013, the entire content of which is hereby incorporated by reference.

BACKGROUND

The present disclosure relates to a display unit including a current-drive display device, a display drive method, a method of manufacturing such a display unit, and an electronic apparatus including such a display unit.

In a field of a display unit performing image display, there has been developed and commercialized in recent years a display unit (such as an organic EL display unit) including, as a light emitting element, a current-drive optical element that emits light of which the luminance varies depending on an applied current value, for example, an organic electro luminescence (EL) device. Unlike a liquid crystal device, etc., the light emitting element is a self-luminous light emitting element and hence provision of a light source (backlight) is not necessary. The organic EL display unit therefore has features of high image viewability, low power consumption, and fast response compared with a liquid crystal display unit which indispensably includes a light source.

For example, the display unit may generate light of any appropriate color by combining light (basic color light) of red (R), green (G), and blue (B). For example, Japanese Unexamined Patent Application Publication No. 2011-90894 discloses an organic EL display unit, in which a light emitting layer emitting cyan light and a light emitting layer emitting magenta light are stacked on one substrate, and light emitted from such two light emitting layers is allowed to pass through color filters to separate light of red, green, and blue.

SUMMARY

A parameter indicating image quality of the display unit includes resolution. For example, the resolution may be evaluated by the number of pixels per inch (ppi). As the resolution is higher, a display image is smoother and thus image quality is higher; hence, a display unit having a high resolution is often preferred. In particular, in a portable terminal such as, for example, a smartphone, since a viewer observes a display screen at a short distance, the display unit desirably has high resolution.

In general, an electronic apparatus is desired to be low in power consumption from an ecological point of view, etc. The display unit is also promisingly reduced in power consumption.

It is desirable to provide a display unit, a display drive method, a method of manufacturing the display unit, and an electronic apparatus capable of increasing resolution and reducing power consumption.

According to an embodiment of the present disclosure, there is provided a display unit including a plurality of display function layers provided in a stacking direction, and each including a plurality of pixel circuits. A pixel circuit group configured by predetermined number of the pixel circuits configures a single display pixel, and the predetermined number of the pixel circuits spans the plurality of display function layers.

According to an embodiment of the present disclosure, there is provided a display drive method including: preparing a first display function layer and a second display function layer, the first display function layer including a plurality of pixel circuits, and the second display function layer including a plurality of pixel circuits and being disposed in a stacking direction of the first display function layer; and performing scanning of a plurality of display pixels on a pixel line basis, each of the display pixels including one or more first pixel circuits in the plurality of pixel circuits provided in the first display function layer and a plurality of second pixel circuits in the plurality of pixel circuits provided in the second display function layer.

According to an embodiment of the present disclosure, there is provided a method of manufacturing a display unit, the method including: fabricating a plurality of display function layers each including a plurality of pixel circuits; and overlaying the plurality of display function layers on one another to allow a pixel circuit group configured by predetermined number of the pixel circuits to configure a single display pixel, the predetermined number of the pixel circuits spanning the plurality of display function layers.

According to an embodiment of the present disclosure, there is provided an electronic apparatus provided with a display unit and a control section. The control section is configured to perform operation control on the display unit. The display unit includes a plurality of display function layers provided in a stacking direction, and each including a plurality of pixel circuits. A pixel circuit group configured by predetermined number of the pixel circuits configures a single display pixel, and the predetermined number of the pixel circuits spans the plurality of display function layers. Examples of the electronic apparatus may include a television unit, a digital camera, a personal computer, a video camera, and a portable terminal unit such as a mobile phone.

In the display unit, the display drive method, the method of manufacturing a display unit, and the electronic apparatus according to the above-described respective embodiments of the present disclosure, an image is displayed by the plurality of display function layers disposed in a stacking direction. Each of the display pixels is configured by the pixel circuit group configured by the predetermined number of the pixel circuits spanning the plurality of display function layers.

According to the display unit, the display drive method, the method of manufacturing a display unit, and the electronic apparatus of the above-described respective embodiments of the present disclosure, a single display pixel is configured by the pixel circuit group configured by the predetermined number of the pixel circuits spanning the plurality of display function layers. Therefore, an increase in resolution is achieved together with reduction in power consumption.

It is to be understood that both the foregoing general description and the following detailed description are exemplary, and are intended to provide further explanation of the technology as claimed.

Additional features and advantages are described herein, and will be apparent from the following Detailed Description and the figures.

BRIEF DESCRIPTION OF THE FIGURES

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

Hereinafter, some embodiments of the disclosure will be described in detail with reference to the accompanying drawings. It is to be noted that description is made in the following order.
1. First Embodiment.
2. Second Embodiment.
3. Third Embodiment.
4. Application Examples.

1. First Embodiment

Exemplary Configuration

Figure 1:
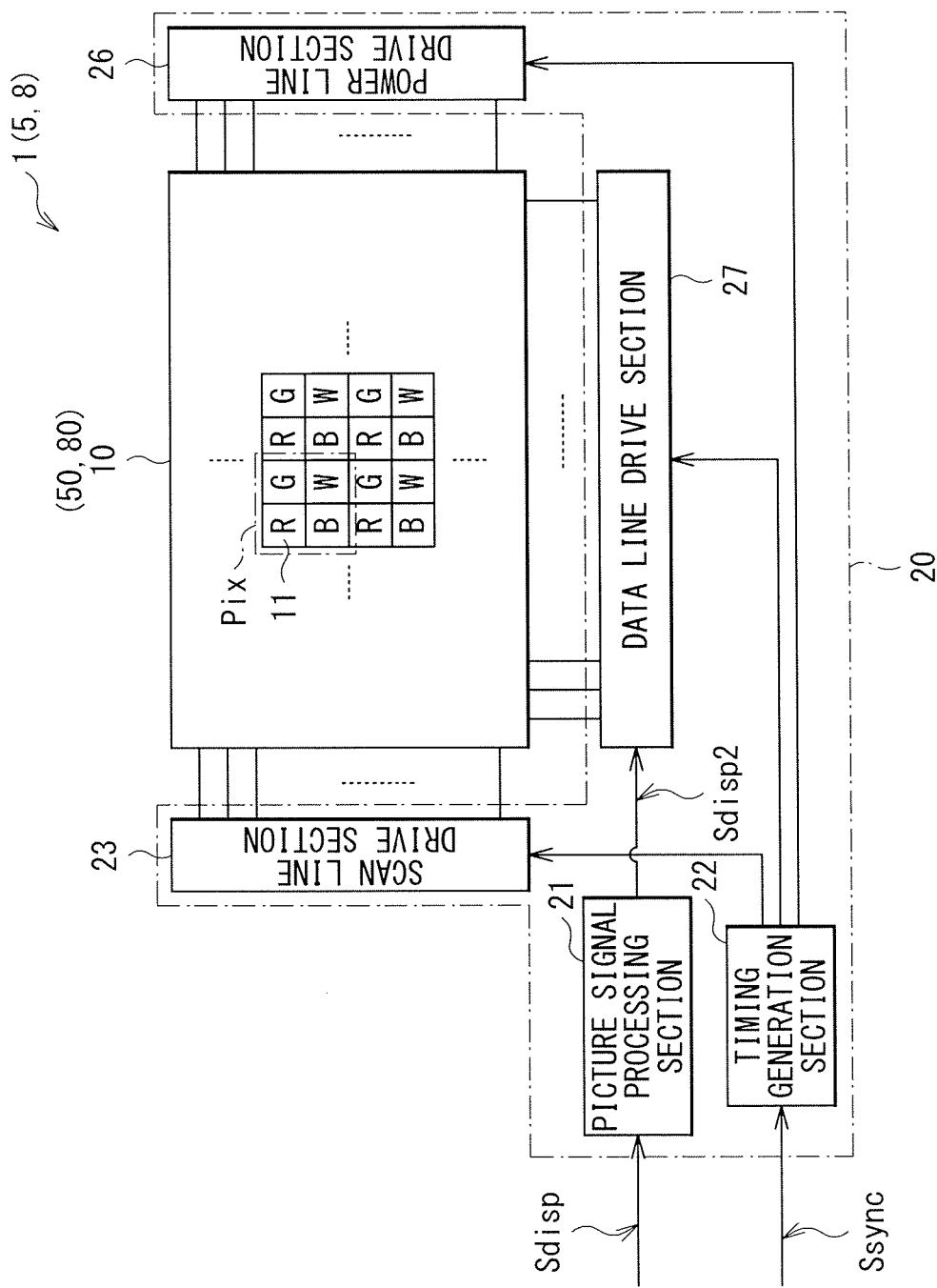
FIG. 1 is a block diagram illustrating an exemplary configuration of a display unit according to an embodiment of the present disclosure.

FIG. 1 illustrates an exemplary configuration of a display unit according to a first embodiment. The display unit 1 may be an active-matrix display unit using an organic EL device. Since a display drive method and a method of manufacturing a display unit according to example embodiments of the present disclosure are embodied by the first embodiment, the display drive method and the method of manufacturing a display unit are described together.

The display unit 1 includes a display section 10 and a drive section 20. The drive section 20 includes a picture signal processing section 21, a timing generation section 22, a scan line drive section 23, a power line drive section 26, and a data line drive section 27.

The display section 10 includes a plurality of pixels Pix arranged in a matrix. Each pixel Pix includes four sub-pixels 11 (11R, 11G, 11B, and 11W) of red (R), green (G), blue (B), and white (W). In this exemplary case, the four sub-pixels 11R, 11G, 11B, and 11W are arranged in two-row-two-column in the pixel Pix. Specifically, in the pixel Pix, the red (R) sub-pixel 11R is disposed at upper left, the green (G) sub-pixel 11G is disposed at upper right, the blue (B) sub-pixel 11B is disposed at lower left, and the white (W) sub-pixel 11W is disposed at lower right.

Figure 2:
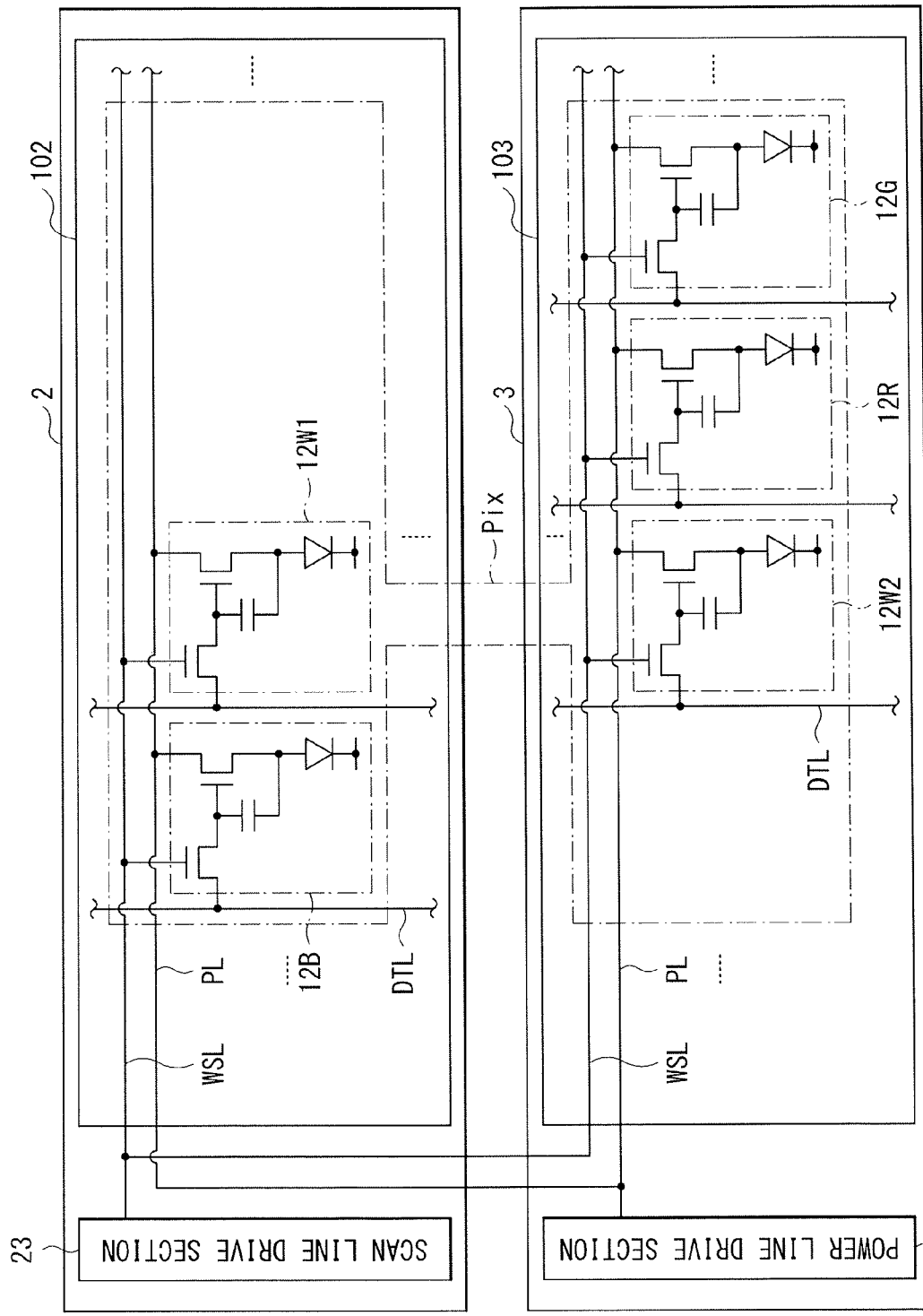
FIG. 2 is a schematic diagram illustrating an exemplary configuration of a display section illustrated in FIG. 1.

FIG. 2 illustrates an exemplary configuration of the display section 10 together with the scan line drive section 23 and the power line drive section 26. The display section 10 is configured of a pixel array 102 provided in an upper substrate 2 and a pixel array 103 provided in a lower substrate 3. As described later, the upper substrate 2 and the lower substrate 3 are bonded together so as to overlay each other. The pixel array 102 includes pixel circuits 12B and 12W1, while the pixel array 103 includes pixel circuits 12W2, 12R, and 12G. The pixel circuit 12R and a red color filter 206 described later configure a sub-pixel 11R, the pixel circuit 12G and a green color filter 206 described later configure a sub-pixel 11G, and the pixel circuit 12B and a blue color filter 206 described later configure a sub-pixel 11B. The pixel circuits 12W1 and 12W2 and a white color filter 206 described later configure a sub-pixel 11W. In this way, each pixel Pix is configured of the two pixel circuits 12B and 12W1 provided in the upper substrate 2 and three pixel circuits 12W2, 12R, and 12G provided in the lower substrate 3. In the following, the term "pixel circuit 12" is used where appropriate to denote one of the pixel circuits 12R, 12G, 12B, 12W1, and 12W2.

Each of the pixel arrays 102 and 103 includes a plurality of scan lines WSL and of power lines PL extending in a row direction, and a plurality of data lines DTL extending in a column direction. Each pixel circuit 12 is connected to the scan line WSL, the power line PL, and the data line DTL. One end of the scan line WSL is connected to the scan line drive section 23, and one end of the power line PL is connected to the power line drive section 26. One end of the data line DTL is connected to an undepicted data line drive section 27. In this exemplary case, a scan line WSL connected to the pixel circuits 12B and 12W1 in the upper substrate 2 belonging to a certain pixel Pix is connected to a scan line WSL connected to the pixel circuits 12W2, 12R, and 12G in the lower substrate 3 belonging to that pixel Pix. Similarly, a power line PL connected to the pixel circuits 12B and 12W1 in the upper substrate 2 belonging to a certain pixel Pix is connected to a power line PL connected to the pixel circuits 12W2, 12R, and 12G in the lower substrate 3 belonging to that pixel Pix.

Figure 3:
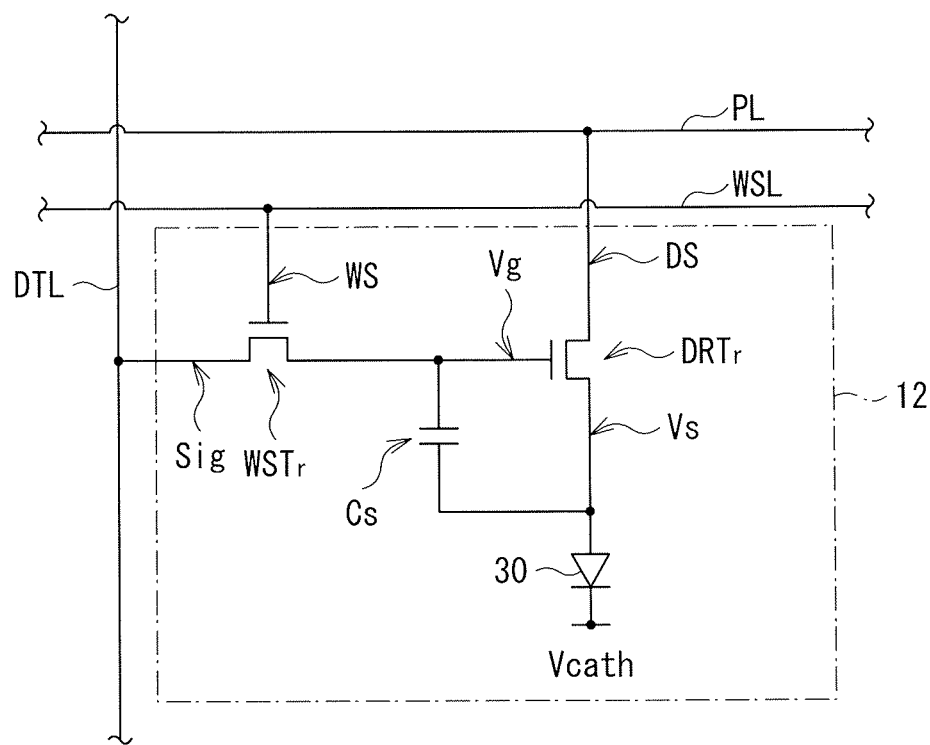
FIG. 3 is a circuit diagram illustrating an exemplary configuration of a pixel circuit illustrated in FIG. 2.

FIG. 3 illustrates an exemplary circuit configuration of the pixel circuit 12. The pixel circuit 12 includes a write transistor WSTr, a drive transistor DRTr, a light emitting element 30, and a capacitor Cs. Specifically, in this exemplary case, the pixel circuit 12 has a configuration of so-called "2Tr1C" including two transistors (the write transistor WSTr and the drive transistor DRTr) and one capacitor Cs.

Each of the write transistor WSTr and the drive transistor DRTr may be configured of, for example, a thin film transistor (TFT) of an N-channel metal oxide semiconductor (MOS) type. The write transistor WSTr has a gate connected to the scan line WSL, a source connected to the data line DTL, and a drain connected to a gate of the drive transistor DRTr and a first end of the capacitor Cs. The drive transistor DRTr has a gate connected to the drain of the write transistor WSTr and the first end of the capacitor Cs, a drain connected to the power line PL, and a source connected to a second end of the capacitor Cs and an anode of the light emitting element 30.

The first end of the capacitor Cs may be connected to, for example, the gate of the drive transistor DRTr, and the second end thereof may be connected to, for example, the source of the drive transistor DRTr. The light emitting element 30 is a light emitting element configured of an organic EL device, of which the anode is connected to the source of the drive transistor DRTr and the second end of the capacitor Cs, and the cathode receives a voltage Vcath as a predetermined direct-current voltage from the drive section 20. As described later, a light emitting element 30 of each of the pixel circuits 12B and 12W1 in the upper substrate 2 emits blue light, while a light emitting element 30 of each of the pixel circuits 12W2, 12R, and 12G in the lower substrate 3 emits yellow light.

Figure 4:
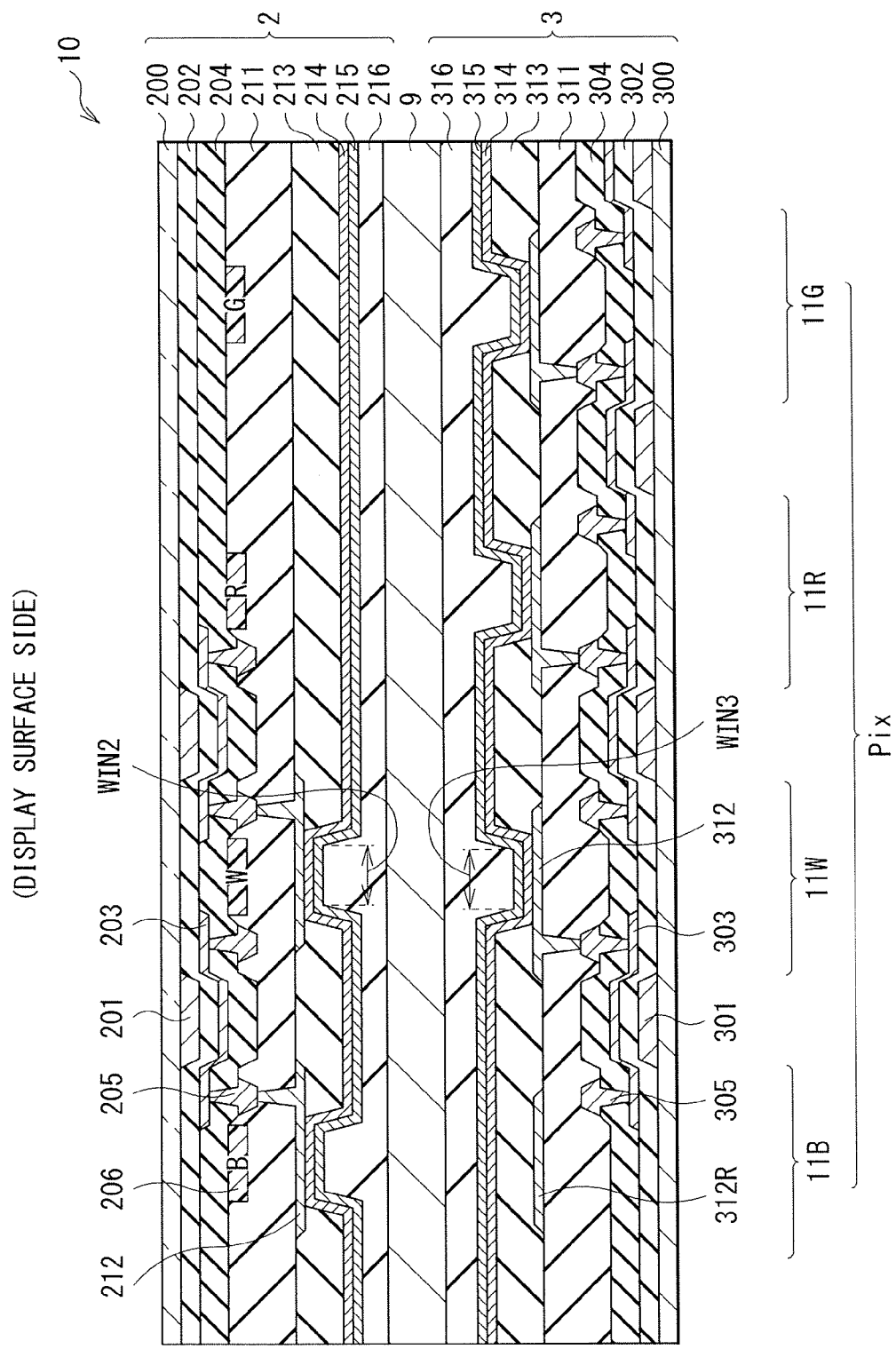
FIG. 4 is a sectional diagram illustrating an exemplary configuration of a display section according to a first embodiment.

FIG. 4 illustrates a sectional diagram of the display section 10. As illustrated in FIG. 4, the upper substrate 2 is bonded to the lower substrate 3 by a bonding material 9. The bonding material 9 is formed of a transparent or semitransparent resin, and is insulative in this exemplary case.

The upper substrate 2 includes a transparent substrate 200, a gate 201, a polysilicon 203, a color filter 206, an anode 212, a blue light emitting layer 214, and a cathode 215. The transparent substrate 200 serves as a support substrate of the upper substrate 2, and, for example, may be formed of glass or plastic. A gate 201 is provided on the transparent substrate 200. For example, the gate 201 may be formed of molybdenum (Mo), or the like. An insulating layer 202 is provided on the transparent substrate 200 and the gate 201. For example, the insulating layer 202 may be formed of silicon oxide ($SiO_2$), silicon nitride (SiNx), or the like. Polysilicon 203 is provided on the insulating layer 202 in a region corresponding to the gate 201. The gate 201 and the polysilicon 203 configure the drive transistor DRTr. An insulating layer 204 is provided on the polysilicon 203 and the insulating layer 202. For example, the insulating layer 204 may be formed of a material similar to that of the insulating layer 202. A contact-and-wiring 205 is provided in part of a region where the polysilicon 203 is provided while running though the insulating layer 204. For example, the wiring 205 may be configured of three layers of titanium (Ti), aluminum (Al), and titanium (Ti). Color filters 206 are provided on the insulating layer 204. Specifically, a red (R) color filter 206 is provided in a portion corresponding to the sub-pixel 11R, a green (G) color filter 206 is provided in a portion corresponding to the sub-pixel 11G, a blue (B) color filter 206 is provided in a portion corresponding to the sub-pixel 11B, and a white (W) color filter 206 is provided in a portion corresponding to the sub-pixel 11W. The color filter 206 of the sub-pixel 11B is provided to adjust a color gamut of blue (B) light emitted by the blue light emitting layer 214 described later, and the color filter 206 of the sub-pixel 11W is provided to adjust a color gamut of white (W) light emitted as synthesized light by the blue light emitting layer 214 and a yellow light emitting layer 314 described later.

An insulating layer 211 is provided on the insulating layer 204 and the color filter 206. For example, the insulating layer 211 may be formed of polyimide, an acrylic resin, or the like. Specifically, the insulating layer 211 is configured of a transparent material. On the insulating layer 211, the anode 212 is provided in a region concerning the sub-pixels 11B and 11W. The anode 212 is connected to the contact-and-wiring 205 that runs through the insulating layer 211 up to the source of the drive transistor DRTr. For example, the anode 212 may be formed of indium tin oxide (ITO). Specifically, the anode 212 may be transparent or semitransparent. For example, the anode 212 may be provided with a thickness of tens to hundreds of nanometers. An insulating layer 213 is provided on the anode 212 and the insulating layer 211. For example, the insulating layer 213 may be formed of a material similar to that of the insulating layer 212. The insulating layer 213 has an opening WIN2 in part of its region under which the anode 212 is provided. The blue light emitting layer 214 is uniformly provided on the anode 212 and the insulating layer 213. The blue light emitting layer 214 is an organic EL layer, and emits blue (B) light in this exemplary case. The cathode 215 is uniformly provided on the blue light emitting layer 214. The cathode 215 may be a transparent or semitransparent electrode, and, for example, may be formed of magnesium-silver (MgAg) or IZO (registered trademark). In the case where the cathode 215 is formed of magnesium-silver, the cathode 215 may be semitransparent by adjusting a thickness thereof to be about several nanometers, for example. In the case where the cathode 215 is formed of IZO, the cathode 215 may be desirably formed with a thickness of tens to thousands of nanometers, for example. Specifically, IZO is a transparent material but has a slightly high electric resistivity; hence, IZO is desirably formed slightly thick in order to decrease a resistance value of the cathode 215. The anode 212, the blue light emitting layer 214, and the cathode 215 configure the light emitting element 30. An insulating layer 216 is provided on the cathode 215. For example, the insulating layer 216 may be formed of silicon nitride (SiNx), or the like. The insulating layer 216 functions as a protective layer in order to reduce a possibility of degradation in light emitting characteristics, etc. of the blue light emitting layer 214 due to exposure of the upper substrate 2 to air during a manufacturing process.

According to such a configuration, light emitted from the opening WIN2 of the blue light emitting layer 214 in the upper substrate 2 advances toward the transparent substrate 200 as the support substrate of the upper substrate 2. Specifically, light emitted to a top side in FIG. 4 from the blue light emitting layer 214 advances to a display surface side through the color filter 206, while light emitted to a bottom side in FIG. 4 from the blue light emitting layer 214 is reflected by an anode 312 (described later) and a reflecting film 312R (described later) in the lower substrate 3, and advances to the display surface side through the color filter 206. In other words, the light emitting element provided in the upper substrate 2 is a so-called light emitting element of a bottom emission type.

The lower substrate 3 includes a substrate 300, a gate 301, a polysilicon 303, and anode 312, a reflecting film 312R, a yellow light emitting layer 314, and a cathode 315. The substrate 300 serves as a support substrate of the lower substrate 3, and, for example, may be formed of glass or plastic. It is to be noted that a metal substrate having an insulating layer on a surface thereof may be used as the substrate 300. Specifically, the substrate 300 may not be transparent unlike the transparent substrate 200 in the upper substrate 2. As in the case of the upper substrate 2, the gate 301, an insulating layer 302, the polysilicon 303, an insulating layer 304, and a contact-and-wiring 305 are provided on the substrate 300.

An insulating layer 311 is provided on the insulating layer 304. For example, the insulating layer 311 may be formed of polyimide, acrylic resin, or the like. On the insulating layer 311, the anode 312 is provided in a region corresponding to each of the sub-pixels 11R, 11G, and 11W, and the reflecting film 312R is provided in a region corresponding to the sub-pixel 11B. The anode 312 is connected to the contact-and-wiring 305 that runs through the insulating layer 311 up to the source of the drive transistor DRTr. For example, the anode 312 and the reflecting film 312R may be formed of ITO-Al alloy or Al alloy. Specifically, the anode 312 and the reflecting film 312R desirably have a light-reflecting property. An insulating layer 313 is provided on the anode 312, the reflecting film 312R, and the insulating layer 311. For example, the insulating layer 313 may be formed of a material similar to that of the insulating layer 311. The insulating layer 313 has openings WIN3 each of which is formed on part of a region where the anode 312 is provided. In this exemplary case, size of the opening WIN3 is substantially the same as size of the opening WIN2 in the upper substrate 2. The yellow light emitting layer 314 is uniformly provided on the anode 312 and the insulating layer 313. The yellow light emitting layer 314 is an organic EL layer, and emits yellow (Y) light in this exemplary case. The yellow light emitting layer 314 may be formed of a yellow-emitting material, or may be formed of a green (G)-emitting material doped with a red (R)-emitting material. The cathode 315 is provided on the yellow light emitting layer 314. The cathode 315 may be a transparent or semitransparent electrode, and, for example, may be formed of magnesium-silver (MgAg) or IZO. In the case where the cathode 315 is formed of magnesium-silver, the cathode 315 may be semitransparent by adjusting a thickness thereof to be about several nanometers, for example. In the case where the cathode 315 is formed of IZO, the cathode 315 may be desirably formed with a thickness of tens to thousands of nanometers, for example. An insulating layer 316 is provided on the cathode 315. For example, the insulating layer 316 may be formed of silicon nitride (SiNx), or the like. The insulating layer 316 functions as a protective layer in order to reduce a possibility of degradation in light emitting characteristics, etc. of the yellow light emitting layer 314 due to exposure of the lower substrate 3 to air during a manufacturing process.

According to such a configuration, light emitted from the opening WIN3 of the yellow light emitting layer 314 in the lower substrate 3 advances in a direction opposite to a direction to the substrate 300 as the support substrate of the lower substrate 3. In other words, the light emitting element provided in the lower substrate 3 is a so-called light emitting element of a top emission type.

In this way, the display section 10 performs display by emitting light to the top side in FIG. 4. Specifically, in the sub-pixel 11R, the yellow (Y) light emitted from the opening WIN3 of the yellow light emitting layer 314 in the lower substrate 3 advances to the top side in FIG. 4, and is output from the display surface through the red (R) color filter 206. Specifically, since the yellow light contains a red light component and a green light component, the red light component is separated by the red color filter 206 and is output. In the sub-pixel 11G, the yellow (Y) light emitted from the opening WIN3 of the yellow light emitting layer 314 in the lower substrate 3 advances to the top side in FIG. 4, and is output from the display surface through the green (G) color filter 206. In the sub-pixel 11B, the blue (B) light emitted from the opening WIN2 of the blue light emitting layer 214 in the upper substrate 2 advances to the top side in FIG. 4, and is output from the display surface through the blue (B) color filter 206. In the sub-pixel 11W, the blue (B) light emitted from the opening WIN2 of the blue light emitting layer 214 in the upper substrate 2 and the yellow (Y) light emitted from the opening WIN3 of the yellow light emitting layer 314 in the lower substrate 3 advance to the top side in FIG. 4, and is output from the display surface through the white (W) color filter 206. In other words, blue light and yellow light are mixed into white light that is output through the white color filter 206.

Figure 5:
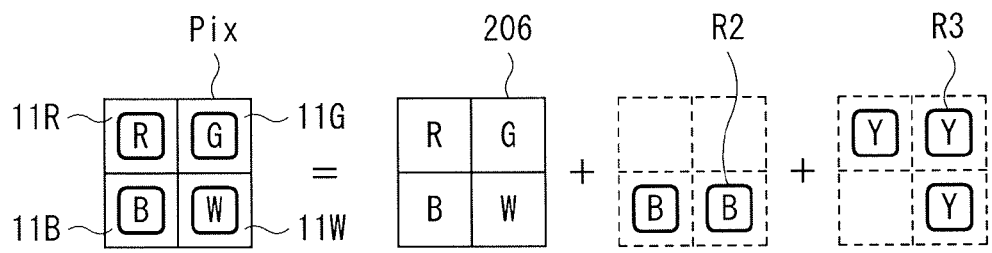
FIG. 5 is a schematic diagram illustrating a function of a pixel illustrated in FIG. 1.

FIG. 5 schematically illustrates a function of the pixel Pix. In each of the four sub-pixels 11R, 11G, 11B, and 11W of the pixel Pix, one or both of blue (B) light emitted form a light emitting region (an upper-substrate light-emitting region R2) of the upper substrate 2 and yellow (Y) light emitted form a light emitting region (a lower-substrate light-emitting region R3) of the lower substrate 3 passes through the color filter 206. The upper-substrate light-emitting region R2 is provided at a position corresponding to the sub-pixels 11B and 11W, and the lower-substrate light-emitting region R3 is provided at a position corresponding to the sub-pixels 11R, 11G, and 11W.

Figure 6A:
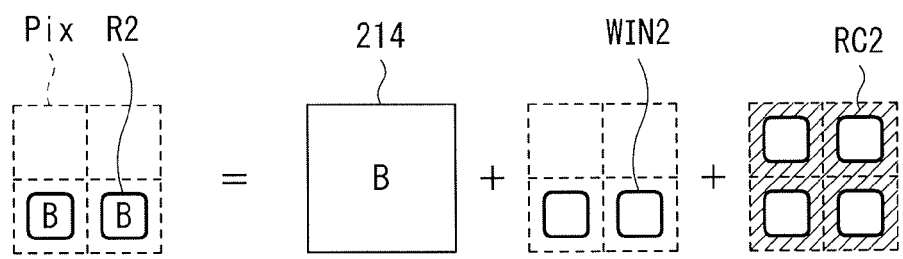
FIG. 6A is a schematic diagram illustrating a function of an upper-substrate light-emitting region illustrated in FIG. 5.
Figure 6B:
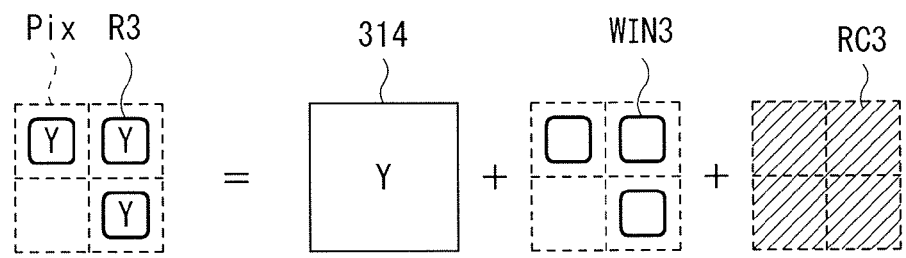
FIG. 6B is a schematic diagram illustrating a function of a lower-substrate light-emitting region illustrated in FIG. 5.

FIG. 6A schematically illustrates a function of the upper-substrate light-emitting region R2. FIG. 6B schematically illustrates a function of the lower-substrate light-emitting region R3. In the upper-substrate light-emitting region R2, as illustrated in FIG. 6A, light is emitted from the openings WIN2 of the blue light emitting layer 214. In the lower-substrate light-emitting region R3, as illustrated in FIG. 6B, light is emitted from the openings WIN3 of the yellow light emitting layer 314. In the lower substrate 3, as illustrated in FIG. 6B, the write transistor WSTr, the drive transistor DRTr, and the capacitor Cs of the three pixel circuits 12R, 12G, and 12W2 may each be disposed at any place in a region of the pixel Pix (a lower-substrate circuit region RC3). Specifically, as illustrated in FIG. 4, such elements are provided on the substrate 300 in the lower substrate 3; hence, the elements each do not obstruct advancement of light wherever the element is disposed. On the other hand, in the upper substrate 2, as illustrated in FIG. 6A, the write transistor WSTr, the drive transistor DRTr, and the capacitor Cs in each of the two pixel circuits 12B and 12W1 are provided in a region (an upper-substrate circuit region RC2) out of the region of each opening WIN2 in the upper substrate 2 and out of a region of each opening WIN3 in the lower substrate 3. Specifically, as illustrated in FIG. 4, such elements are provided on the transparent substrate 200 in the upper substrate 2; hence, the elements are disposed in the upper-substrate circuit region RC2 so as not to obstruct advancement of light.

Description is now made on connection of each scan line WSL in the upper substrate 2 with each scan line WSL in the lower substrate 3 as illustrated in FIG. 2. It is to be noted that the same holds true for connection of each power line PL in the upper substrate 2 with each power line PL in the lower substrate 3.

Figure 7A:
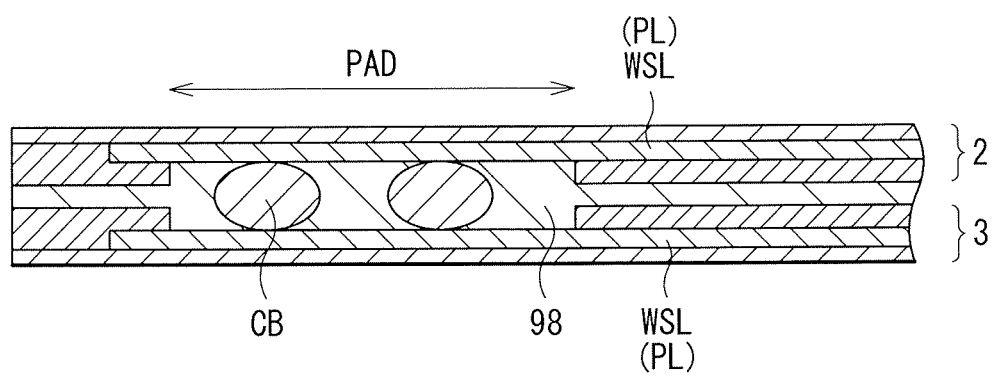
FIG. 7A is a sectional diagram illustrating an exemplary connection portion of an upper substrate with a lower substrate illustrated in FIG. 2.

FIG. 7A illustrates a connection portion of the scan line WSL in the upper substrate 2 with the scan line WSL in the lower substrate 3. In this connection portion, a pad PAD is provided in each of the upper substrate 2 and the lower substrate 3. The pad PAD is a portion where the scan line WSL is exposed in each of the upper substrate 2 and the lower substrate 3. In the region where the pad PAD is provided, a resin 98 containing conductive particles CB is filled between the upper substrate 2 and the lower substrate 3 in an enclosable manner. For example, nickel particles or gold-plated resin particles may be used as the conductive particles CB. According to such a configuration, the scan line WSL in the upper substrate 2 is electrically connected with the scan line WSL in the lower substrate 3 via the conductive particles CB.

Figure 7B:
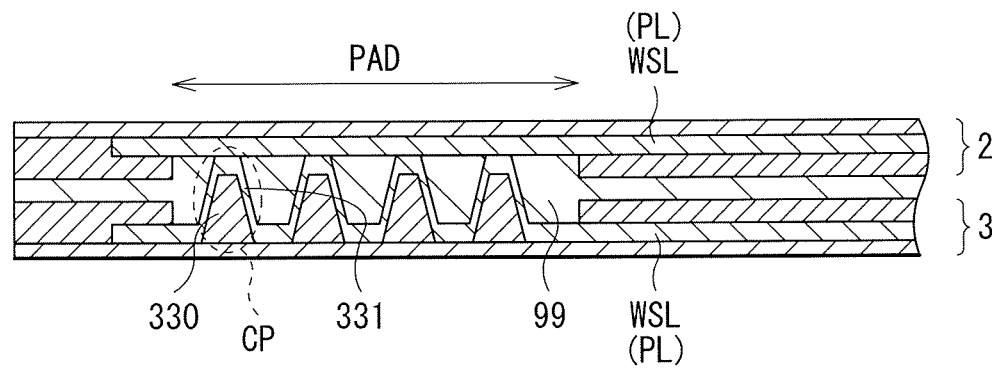
FIG. 7B is a sectional diagram illustrating another exemplary connection portion of the upper substrate and the lower substrate illustrated in FIG. 2.

It is to be noted that such a configuration is not limitative. For example, a configuration as illustrated in FIG. 7B may be used. In this exemplary case, conductive posts CP are provided between the upper substrate 2 and the lower substrate 3. For example, such a post CP may be formed by photolithography or evaporation. In this exemplary case, the post CP is formed of an insulative post 330 and a conductive film 331. For example, the insulative post 330 may be formed of polyimide, acrylic resin, or novolac resin by which a thick film is easily formed. The conductive film 331 is so provided as to cover the insulative post 330. For example, the conductive film 331 may be formed of aluminum (Al), magnesium-silver, or the like.

In FIG. 1, the picture signal processing section 21 performs predetermined signal processing on an externally supplied picture signal Sdisp to generate a picture signal Sdisp2. Examples of the predetermined signal processing may include gamma correction, overdrive correction, and the like.

The timing generation section 22 is a circuit that, in response to an externally supplied synchronizing signal Ssync, supplies a control signal to each of the scan line drive section 23, the power line drive section 26, and the data line drive section 27 to allow the sections to operate in synchronization with one another.

In response to a control signal supplied from the timing generation section 22, the scan line drive section 23 sequentially applies scan signals WS to the plurality of scan lines WSL to sequentially select the pixel circuits 12. In this exemplary case, as illustrated in FIG. 2, the scan line drive section 23 is provided in a region outside the pixel array 102 (so-called bezel region) in the upper substrate 2.

In response to a control signal supplied from the timing generation section 22, the power line drive section 26 sequentially applies drive signals DS to the plurality of power lines PL to control light emitting operation and extinction operation of each light emitting element 30 of the pixel circuit 12. The drive signals DS each make a transition from a voltage Vccp to a voltage Vini and vice versa. As described later, the voltage Vini is a voltage for initialization of the pixel circuit 12, and the voltage Vccp is a voltage that allows a current Ids to flow through the drive transistor DRTr for light emission of the light emitting element 30. In this exemplary case, as illustrated in FIG. 2, the power line drive section 26 is provided in a region outside the pixel array 103 (so-called bezel region) in the lower substrate 3.

In this exemplary case, the scan line drive section 23 is provided in the upper substrate 2, while the power line drive section 26 is provided in the lower substrate 3. This is however not limitative. Alternatively, for example, the scan line drive section 23 may be provided in the lower substrate 3, while the power line drive section 26 may be provided in the upper substrate 2.

In response to the picture signal Sdisp2 supplied from the picture signal processing section 21 and a control signal supplied from the timing generation section 22, the data line drive section 27 generates a signal Sig containing a pixel voltage Vsig instructing luminance of emission light of the light emitting element 30 in each pixel circuit 12 and containing a voltage Vofs for Vth correction described later, and applies the signal Sig to each data line DTL.

According to such a configuration, as described later, the drive section 20 performs correction (Vth correction and mobility (μ) correction) to minimize influence of variations due to the drive transistor DRTr on image quality, and writes the pixel voltage Vsig into the pixel circuit 12 within one horizontal period. Then, the light emitting element 30 of the pixel circuit 12 emits light with a luminance corresponding to the received pixel voltage Vsig.

The upper substrate 2 corresponds to a specific but not limitative example of "first display function layer" in one embodiment of the disclosure, and the lower substrate 3 corresponds to a specific but not limitative example of "second display function layer" in one embodiment of the disclosure.

The pixel Pix corresponds to a specific but not limitative example of "display pixel" in one embodiment of the disclosure. The blue light emitting layer 214 corresponds to a specific but not limitative example of "first light emitting layer" in one embodiment of the disclosure, and the yellow light emitting layer 314 corresponds to a specific but not limitative example of "second light emitting layer" in one embodiment of the disclosure. The layer in which the gate 201 is provided and a layer in which the polysilicon 203 is provided collectively correspond to a specific but not limitative example of "first transistor layer" in one embodiment of the disclosure. The layer in which the gate 301 is provided and a layer in which the polysilicon 303 is provided collectively correspond to a specific but not limitative example of "second transistor layer" in one embodiment of the disclosure. The anode 212 corresponds to a specific but not limitative example of "first anode" in one embodiment of the disclosure, and the anode 312 corresponds to a specific but not limitative example of "second anode" in one embodiment of the disclosure. The cathode 215 corresponds to a specific but not limitative example of "first cathode" in one embodiment of the disclosure, and the cathode 315 corresponds to a specific but not limitative example of "second cathode" in one embodiment of the disclosure. The layer of the bonding material 9 corresponds to a specific but not limitative example of "insulating layer" in one embodiment of the disclosure. The region corresponding to the opening WIN2 corresponds to a specific but not limitative example of "first light emitting region" in one embodiment of the disclosure. The region corresponding to the opening WIN3 corresponds to a specific but not limitative example of "second light emitting region" in one embodiment of the disclosure.

[Operation and Functions]

Operation and functions of the display unit 1 according to the first embodiment are now described.

(Summary of Overall Operation)

First, summary of overall operation of the display unit 1 is described with reference to FIG. 1. The picture signal processing section 21 performs predetermined signal processing on the externally supplied picture signal Sdisp to generate a picture signal Sdisp2. In response to the externally supplied synchronizing signal Ssync, the timing generation section 22 supplies a control signal to each of the scan line drive section 23, the power line drive section 26, and the data line drive section 27 to allow the sections to operate in synchronization with one another. In response to the control signal supplied from the timing generation section 22, the scan line drive section 23 sequentially applies scan signals WS to the plurality of scan lines WSL to sequentially select the pixel circuits 12. In response to the control signal supplied from the timing generation section 22, the power line drive section 26 sequentially applies drive signals DS to the plurality of power lines PL to control light emitting operation and extinction operation of the light emitting element 30 in each pixel circuit 12. In response to the picture signal Sdisp2 supplied from the picture signal processing section 21 and the control signal supplied from the timing generation section 22, the data line drive section 27 generates the signal Sig containing the pixel voltage Vsig instructing luminance of emission light of the light emitting element 30 in each pixel circuit 12 and containing the voltage Vofs for Vth correction described later, and applies the signal Sig to each data line DTL. The display section 10 performs display in response to the scan signals WS, the drive signals DS, and the signal Sig supplied from the drive section 20.

(Detailed Operation)

The detailed operation of the display unit 1 is now described.

Figure 8:
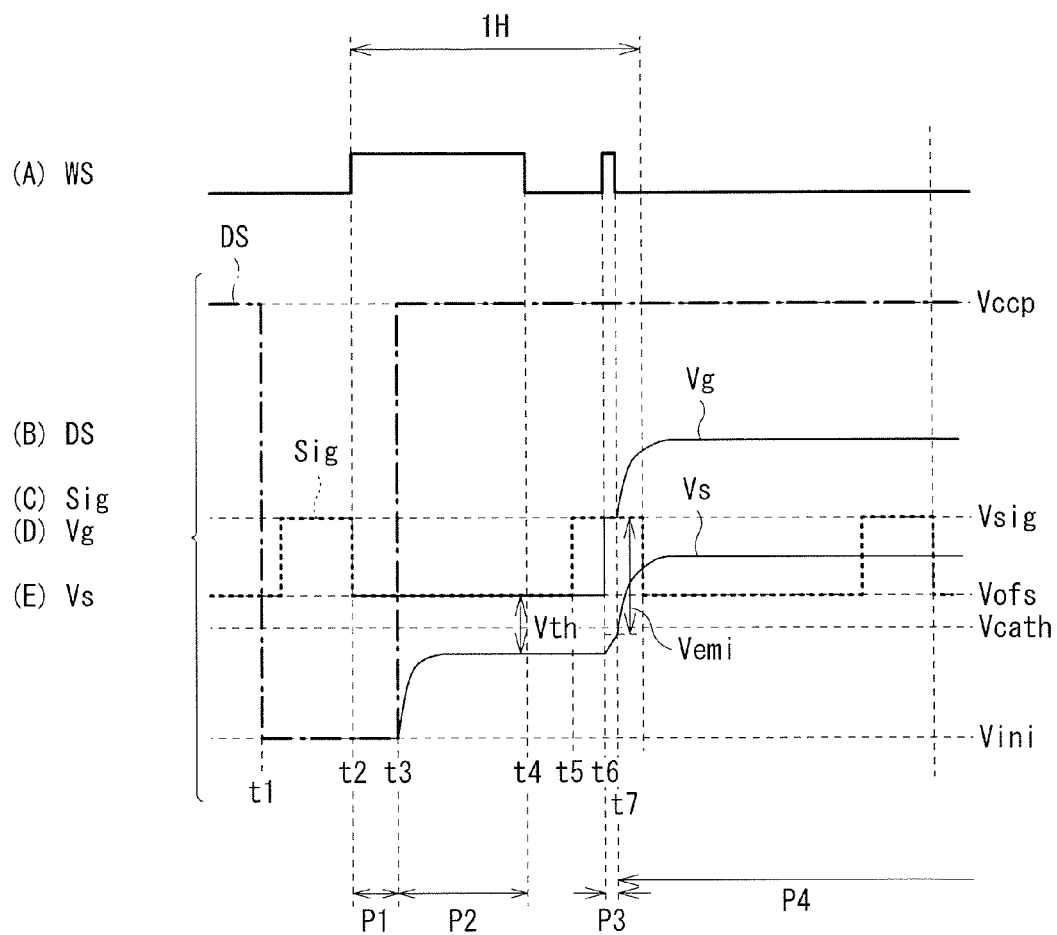
FIG. 8 is a timing waveform chart illustrating an exemplary operation of the pixel circuit illustrated in FIG. 3.

FIG. 8 illustrates a timing chart of operation of the display unit 1, where (A) illustrates a waveform of the scan signal WS, (B) illustrates a waveform of the drive signal DS, (C) illustrates a waveform of the signal Sig, (D) illustrates a waveform of a gate voltage Vg of the drive transistor DRTr, and (E) illustrates a waveform of a source voltage Vs of the drive transistor DRTr.

The drive section 20 initializes the pixel circuit 12 (an initialization period P1), performs Vth correction to minimize influence of variations due to the drive transistor DRTr on image quality (a Vth correction period P2), and writes the pixel voltage Vsig to the pixel circuit 12 and performs mobility (μ) correction different from the Vth correction for the pixel circuit 12 (a writing-and-μ correction period P3) within one horizontal period (1H). Then, the light emitting element 30 emits light with a certain luminance corresponding to the received pixel voltage Vsig (a light emitting period P4). This operation is described in detail below.

First, the power line drive section 26 changes the voltage of the drive signal DS from a voltage Vccp to a voltage Vini at timing t1 prior to the initialization period P1 ((B)). Consequently, the drive transistor DRTr is turned on, so that the source voltage Vs of the drive transistor DRTr is set to the voltage Vini ((E)).

Subsequently, the drive section 20 initializes the pixel circuit 12 in a period from timing t2 to timing t3 (the initialization period P1). Specifically, at the timing t2, the data line drive section 27 sets the signal Sig to a voltage Vofs ((C)), and the scan line drive section 23 changes the voltage of the scan signal WS from a low level to a high level ((A)). Consequently, the write transistor WSTr is turned on, so that the gate voltage Vg of the drive transistor DRTr is set to the voltage Vofs ((D)). In this way, the gate-to-source voltage Vgs (=Vofs−Vini) of the drive transistor DRTr is set to a voltage that is larger than the threshold voltage Vth of the drive transistor DRTr, and thus the pixel circuit 12 is initialized.

Subsequently, the drive section 20 performs the Vth correction in a period of the timing t3 to timing t4 (the Vth correction period P2). Specifically, the power line drive section 26 changes the voltage of the drive signal DS from the voltage Vini to the voltage Vccp at the timing t3 ((B)). As a result, the drive transistor DRTr operates in a saturated region, so that a current Ids flows from the drain to the source of the drive transistor DRTr, resulting in an increase in source voltage Vs ((E)). During this operation, since the source voltage Vs is lower than the cathode voltage Vcath of the light emitting element 30 in this exemplary case, the light emitting element 30 is maintained to a reverse bias state, so that no current flows through the light emitting element 30. Such an increased source voltage Vs causes a decrease in gate-to-source voltage Vgs, and the current Ids is thus decreased. Such negative feedback operation causes the current Ids to converge toward zero. In other words, the gate-to-source voltage Vgs of the drive transistor DRTr converges to be equal to the threshold voltage Vth of the drive transistor DRTr (Vgs=Vth).

Subsequently, at the timing t4, the scan line drive section 23 changes the voltage of the scan signal WS from a high level to a low level ((A)). Consequently, the write transistor WSTr is turned off. Then, the data line drive section 27 sets the signal Sig to the pixel voltage Vsig at timing t5 ((C)).

Subsequently, the drive section 20 performs writing of the pixel voltage Vsig to the pixel circuit 12 and performs μ correction for the pixel circuit 12 in a period from timing t6 to timing t7 (the writing-and-μ correction period P3). Specifically, at the timing t6, the scan line drive section 23 changes the voltage of the scan signal WS from the low level to the high level ((A)). As a result, the write transistor WSTr is turned on, so that the gate voltage Vg of the drive transistor DRTr rises from the voltage Vofs to the pixel voltage Vsig ((D)). During this operation, the gate-to-source voltage Vgs of the drive transistor DRTr becomes larger than the threshold voltage Vth (Vgs>Vth), and thus the current Ids flows from the drain to the source of the drive transistor DRTr, resulting in an increase in source voltage Vs of the drive transistor DRTr ((E)). Such negative feedback operation allows influence of variations due to the drive transistor DRTr on image quality to be minimized (μ correction), and the gate-to-source voltage Vgs of the drive transistor DRTr is set to a voltage Vemi corresponding to the pixel voltage Vsig.

Subsequently, the drive section 20 allows the light emitting element 30 to emit light in periods on and after the timing t7 (the light emitting period P4). Specifically, the scan line drive section 23 changes the voltage of the scan signal WS from the high level to the low level at the timing t7 ((A)). As a result, the write transistor WSTr is turned off, so that the gate of the drive transistor DRTr maintains a floating state, following which an inter-terminal voltage of the capacitor Cs, i.e., the gate-to-source voltage Vgs of the drive transistor DRTr, is thus maintained. Then, as the current Ids flows through the drive transistor DRTr, the source voltage Vs of the drive transistor DRTr increases ((E)), and the gate voltage Vg of the drive transistor DRTr accordingly increases ((D)). When the source voltage Vs of the drive transistor DRTr exceeds the sum, Vel+Vcath, of the threshold voltage Vel of the light emitting element 30 and the voltage Vcath, a current flows between the anode and the cathode of the light emitting element 30, and thus the light emitting element 30 emits light. In other words, the source voltage Vs increases by an amount of voltage corresponding to the element variations in the light emitting element 30, leading to light emission of the light emitting element 30.

Then, after the lapse of a predetermined period (one frame period), the display unit 1 shifts from the light emitting period P4 to the initialization period P1. The drive section 20 drives each of the sections to repeat such a series of operation.

(Manufacturing Process)

A method of manufacturing the display unit 1 according to one embodiment is now described.

Figure 9:
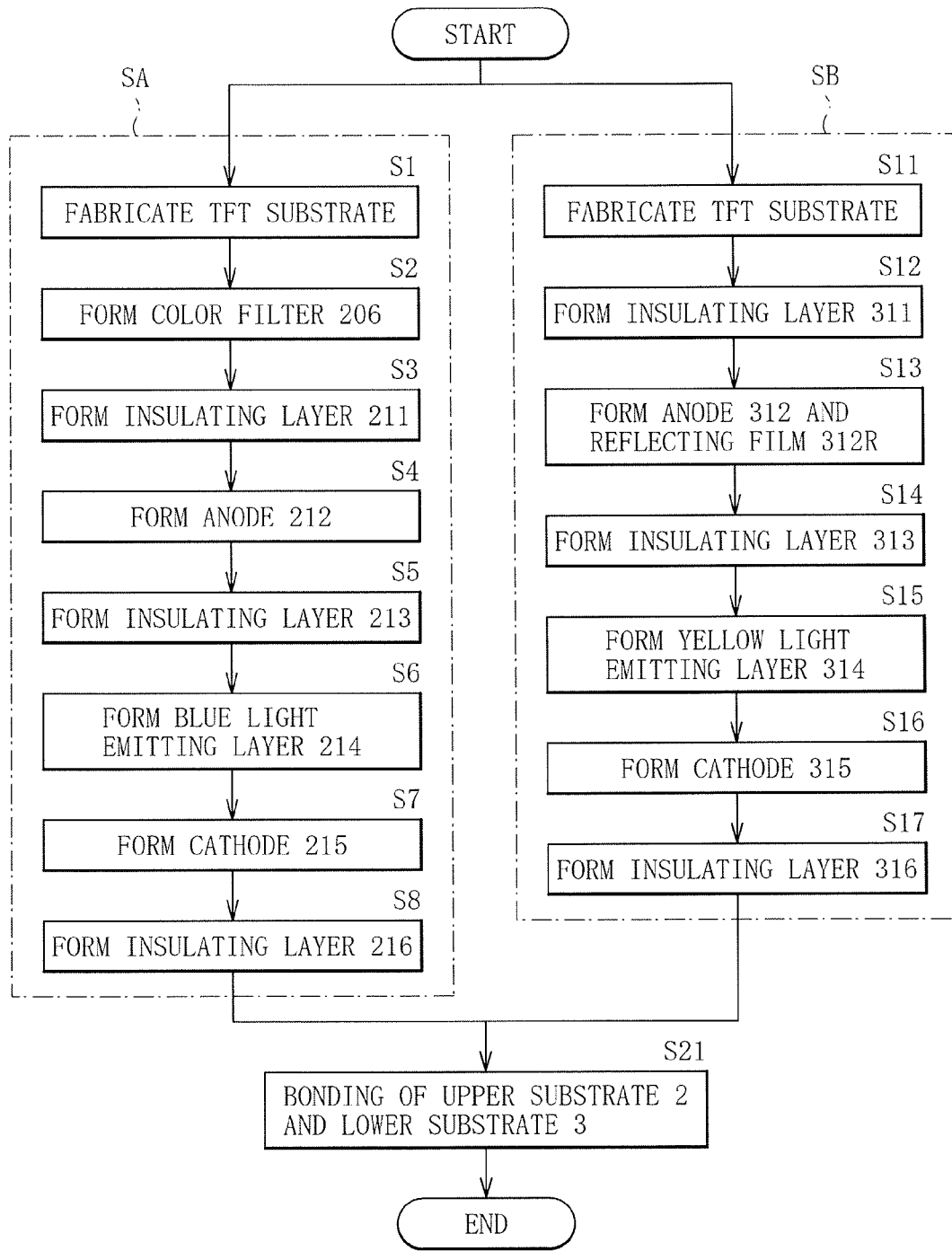
FIG. 9 is a flowchart illustrating a fabrication process of the display section illustrated in FIG. 4.

FIG. 9 illustrates a flowchart of the method of manufacturing the display unit 1. In this manufacturing process, the upper substrate 2 is fabricated in an upper-substrate fabrication process SA, while the lower substrate 3 is fabricated in a lower-substrate fabrication process SB. The upper substrate 2 and the lower substrate 3 fabricated in such processes are bonded together to manufacture the display unit 1. Such fabrication processes are described in detail below.

In the upper-substrate fabrication process SA, first, a TFT substrate is fabricated (step S1). Specifically, as illustrated in FIG. 4, the gate 201, the insulating layer 202, the polysilicon 203, the insulating layer 204, and the contact-and-wiring 205 are formed on the transparent substrate 200 by, for example, photolithography. Various known techniques used for, for example, manufacturing of a liquid crystal display apparatus may be used in the fabrication of the TFT substrate.

Subsequently, the color filters 206 are formed (step S2). Various known techniques used for, for example, manufacturing of a liquid crystal display apparatus may also be used for formation of the color filters 206.

Subsequently, the insulating layer 211 is formed (step S3). In this step, contact holes, which each are to connect the anode 212 to the wiring 205, are formed together. Specifically, for example, first, an insulating film formed of photosensitive polyimide or the like is disposed on the insulating layer 204, and then the insulating film is exposed with a mask of which the portion corresponding to each contact hole is opened, thereby the contact holes are formed.

Subsequently, the anodes 212 are formed by patterning (step S4). Each anode 212 is connected to the wiring 205 through the contact hole.

Subsequently, the insulating layer 213 is formed by patterning in a region other than the opening WIN2 (step S5).

Subsequently, the blue light emitting layer 214 is formed (step S6). The blue light emitting layer 214 is formed by evaporating a light emitting material that emits blue light. In such an evaporation step, for example, the light emitting material may be uniformly evaporated over the entire pixel array 102 using a so-called area mask of which the area corresponding to the pixel array 102 is opened. It is to be noted that the evaporation process is not limited to such a simple process, and, for example, the light emitting material may be evaporated using a slot mask of which the area corresponding to the opening WIN2 is opened.

Subsequently, the cathode 215 is formed (step S7). The cathode 215 is uniformly formed over the entire pixel array 102 using an area mask.

The insulating layer 216 is formed at the end of the upper-substrate fabrication process SA (step S8).

In the lower-substrate fabrication process SB, as with the upper-substrate fabrication process SA, a TFT substrate is fabricated (step S11), the insulating layer 311 is formed (step S12), the anodes 312 and the reflecting film 312R are formed (step S13), the insulating layer 313 is formed (step S14), the yellow light emitting layer 314 is formed (step S15), the cathodes 315 are formed (step S16), and the insulating layer 316 is formed (step S17).

Subsequently, the upper substrate 2 fabricated in the upper-substrate fabrication process SA and the lower substrate 3 fabricated in the lower-substrate fabrication process SB are bonded together (step S21). In a specific exemplary case, first, in a vacuum, a sealed region is formed on one or both of the upper substrate 2 and the lower substrate 3 so as to enclose the pixel arrays 102 and 103, and then a resin for bonding (bonding material 9) is dropped. Subsequently, the upper substrate 2 and the lower substrate 3 are stacked on each other in a vacuum. Subsequently, the degree of vacuum is reduced so that pressure is returned to atmospheric pressure. As a result, the dropped resin is spread in the sealed region, so that the upper substrate 2 and the lower substrate 3 are bonded together. It is to be noted that mechanical pressure may be additionally applied during such bonding.

(Functions of Display Unit)

In the display unit 1, the blue light emitting layer 214 is uniformly provided in the upper substrate 2, the yellow light emitting layer 314 is uniformly provided in the lower substrate 3, and the color filters 206 of red, green, blue, and white are provided. Consequently, as described later in comparison with a comparative example 1, resolution of the display unit 1 is allowed to be increased.

In the display unit 1, the blue light emitting element 30 is provided in the region corresponding to the sub-pixels 11B and 11W in the upper substrate 2, and the yellow light emitting element 30 is provided in the region corresponding to the sub-pixels 11R, 11G, and 11W in the lower substrate 3. Consequently, as described later in comparison with a comparative example 2, for example, power consumption may be decreased compared with a case where white light is generated, from which four colors are generated with color filters.

In the display unit 1, the blue light emitting layer 214 is provided in the upper substrate 2, while the yellow light emitting layer 314 is provided in the lower substrate 3; hence, an aperture ratio is allowed to be increased. Specifically, in the upper substrate 2 closer to the display surface, as illustrated in FIG. 6A, elements such as transistors of the pixel circuit 12 are necessary to be provided in the region (the upper-substrate circuit region RC2) out of the region of the opening WIN2 in the upper substrate 2 and out of the region of the opening WIN3 in the lower substrate 3. Hence, when the yellow light emitting layer is provided in the upper substrate 2, three pixel circuits 12 (pixel circuits 12R, 12G, and 12W2) are necessary to be provided in the upper substrate 2. As a result, the upper-substrate circuit region RC2 is expanded, and thus the opening is narrowed, leading to a possibility of reduction in aperture ratio. In contrast, in the display unit, since the blue light emitting layer 214 is provided in the upper substrate 2, only two pixel circuits 12 (the pixel circuits 12B and 12W1) should be provided in the upper substrate 2, and consequently an aperture ratio is allowed to be increased.

In the display unit 1, as illustrated in FIG. 2, the scan lines WSL in the upper substrate 2 are connected to the scan lines WSL in the lower substrate 3, and the scan line drive section 23 provided in the bezel region of the upper substrate 2 collectively drives such scan lines WSL. In addition, the power lines PL in the upper substrate 2 are connected to the power lines PL in the lower substrate 3, and the power line drive section 26 provided in the bezel region of the lower substrate 3 collectively drives such power lines PL. Consequently, a display unit having a small bezel region is achieved. Specifically, for example, in the case where the scan lines WSL and the power lines PL are separately driven between in the upper substrate 2 and in the lower substrate 3, the scan line drive section 23 and the power line drive section 26 are necessary to be provided in each of the upper substrate 2 and the lower substrate 3; hence, the bezel region may be expanded. In contrast, in the display unit, the scan line drive section 23 and the power line drive section 26 are commonly used between the upper substrate 2 and the lower substrate 3. In addition, the scan line drive section 23 is provided in the upper substrate 2, while the power line drive section 26 is provided in the lower substrate 3; hence the bezel region is allowed to be narrowed.

In the display unit 1, signal lines DTL in the upper substrate 2 and signal lines DTL in the lower substrate 3 are not connected to each other, and thus the data line drive section 27 is allowed to separately drive such signal lines DTL; hence, white balance is easily adjusted. Specifically, for example, in the case where the signal lines DTL in the upper substrate 2 are connected to the signal lines DTL in the lower substrate 3 as with the scan lines WSL, etc., a pixel circuit 12W1 and a pixel circuit 12W2 of a sub-pixel 11W receive the same pixel voltage Vsig. As a result, synthesized light of blue light emitted by a light emitting element 30 of the pixel circuit 12W1 and yellow light emitted by a light emitting element 30 of the pixel circuit 12W2 is possibly deviated from desired white. In this case, for example, white balance may be adjusted through adjustment of luminance of emission light of each of sub-pixels 11R, 11G, and 11B, leading to a possibility of a complicated system. In contrast, in the display unit 1, the signal lines DTL in the upper substrate 2 and the signal lines DTL in the lower substrate 3 are not connected to each other, and thus the data line drive section 27 is allowed to separately drive such signal lines DTL. Hence, white balance is allowed to be adjusted by applying respective different pixel voltages Vsig to a pixel circuit 12W1 and a pixel circuit 12W2 of a sub-pixel 11W. In this case, since luminance of emission light of each of the sub-pixels 11R, 11G, and 11B may not be adjusted, a more simple system is achieved. It is to be noted that, for example, in an application where a requirement for chromaticity is low, and thus white balance is less necessary to be adjusted, the signal lines DTL in the upper substrate 2 and the signal lines DTL in the lower substrate 3 may be connected to each other as with the scan lines WSL, etc.

Functions of the first embodiment are now described in comparison with comparative examples 1 and 2.

Comparative Example 1

A display unit 1R according to the comparative example 1 is a display unit including a display section 10R having a light emitting element of a bottom emission type provided on one transparent substrate. The display section 10R includes sub-pixels SPixR of red (R), green (G), blue (B), and white (W), each sub-pixel SPixR having a light emitting layer ER that emits light of a corresponding color.

Figure 10:
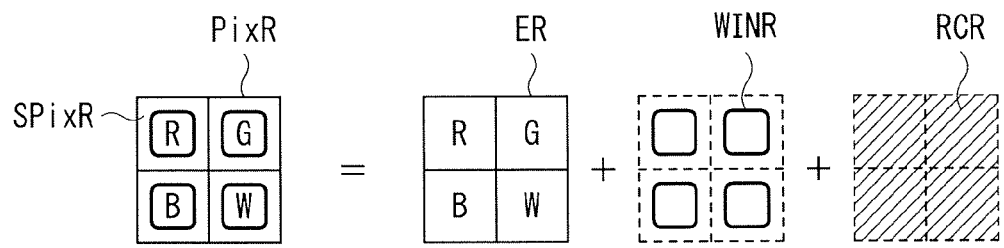
FIG. 10 is a schematic diagram illustrating a function of a pixel according to a comparative example of the first embodiment.

FIG. 10 schematically illustrates a pixel PixR according to the comparative example 1. In the red (R) sub-pixel SPixR, red light is emitted from an opening WINR of the red (R) light emitting layer ER. In the green (G) sub-pixel SPixR, green light is emitted from an opening WINR of the green (G) light emitting layer ER. In the blue (B) sub-pixel SPixR, blue light is emitted from an opening WINR of the blue (B) light emitting layer ER. In the white (W) sub-pixel SPixR, white light is emitted from an opening WINR of the white (W) light emitting layer ER. Elements such as transistors of each of four pixel circuits corresponding to the four sub-pixels SPixR are provided in a region (circuit region RCR) other than the opening WINR as with the upper substrate 2 according to the first embodiment.

In the display unit 1R according to the comparative example 1, the light emitting layers ER that emit light of different colors are provided in the respective sub-pixels SPixR of the four colors, thereby resolution may be reduced. Specifically, for example, such light emitting layers may be formed by evaporation using four masks (slot masks), each of which the region corresponding to the light emitting layer ER of each color is opened, in a manufacturing process. In this step, the light emitting layers ER of the respective colors are formed by "predetermined interval" away from one another in a plane so as to be formed while being appropriately separated from one another. This design rule therefore restricts an upper limit of the number of formable sub-pixels SPixR per unit length (for example, per one inch), and consequently an increase in resolution may be prevented.

Moreover, when the elements such as transistors in the four pixel circuits of a pixel PixR are formed in the circuit region RCR, each sub-pixel SPixR is inevitably expanded in order to ensure area for placement of such elements, and thus an increase in resolution may be prevented.

In contrast, in the display unit 1 according to the first embodiment, the blue light emitting layer 214 is uniformly provided in the upper substrate 2, the yellow light emitting layer 314 is uniformly provided in the lower substrate 3, and the color filters 206 of red, green, blue, and white are provided. As described above, the blue light emitting layer 214 and the yellow light emitting layer 314 are each uniformly evaporated using a so-called area mask in a manufacturing process. Consequently, unlike in the case of the comparative example 1, the display unit 1 has no restriction in design rule on the light emitting layer. The color filters are in general allowed to be patterned with high resolution. The display unit 1 therefore allows resolution to be increased.

Moreover, in the display unit 1, the five pixel circuits 12 of the pixel Pix are dividedly provided between the upper substrate 2 and the lower substrate 3. Specifically, as illustrated in FIG. 2, the two pixel circuits 12B and 12W1 are provided in the upper substrate 2, and the three pixel circuits 12R, 12G, and 12W2 are provided in the lower substrate 3. This makes it possible to decrease the number of elements provided in the upper substrate 2 having a limit in area for placement of the elements such as transistors. Hence, resolution or so-called aperture ratio is allowed to be increased.

Comparative Example 2

A display unit 1S according to a comparative example 2 is a display unit including a display section 10S provided with a plurality of light emitting layers generating white light as synthesized light from which four colors are generated with color filters.

Figure 11:
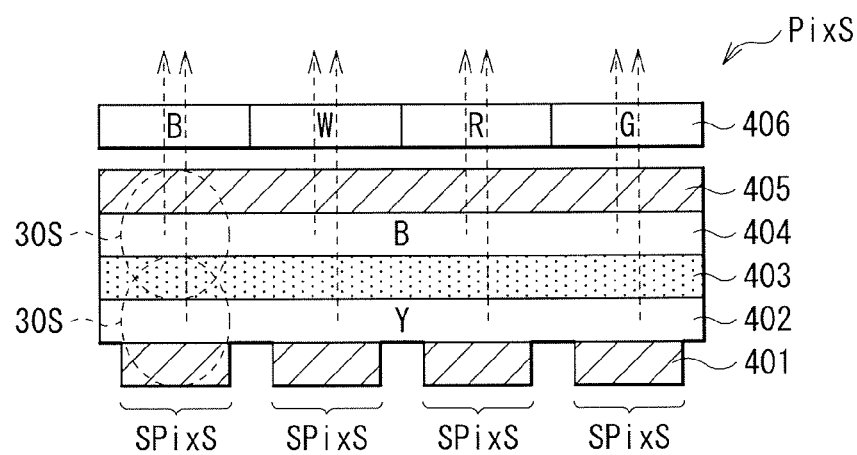
FIG. 11 is a sectional diagram illustrating a schematic sectional structure of a pixel according to another comparative example of the first embodiment.

FIG. 11 schematically illustrates a configuration of a pixel PixS of the display section 10S according to the comparative example 2. The display section 10S includes an anode 401, a yellow light emitting layer 402, a charge generation layer 403, a blue light emitting layer 404, a cathode 405, and color filters 406. The charge generation layer 403 improves an interface of the yellow light emitting layer 402 and the blue light emitting layer 404 to increase hole injection efficiency, and confines exciton generated in the yellow light emitting layer 402 to increase luminous efficiency. This configuration is provided with the yellow light emitting layer 402 and the blue light emitting layer 404, which are each uniformly provided, and with the color filters 406 of red (R), green (G), blue (B), and white (W), and therefore allows resolution to be increased.

In each sub-pixel SPixS, the anode 401, the yellow light emitting layer 402, the charge generation layer 403, the blue light emitting layer 404, and the cathode 405 are stacked in this order. According to this configuration, each sub-pixel SPixS is configured in such a manner that two light emitting elements 30S emitting blue light and yellow light are connected in series. Each sub-pixel SPixS generates white (W) light by the two light emitting elements 30S, and generates a color corresponding to the sub-pixel SPixS from the white light with the color filter 406.

Figure 12:
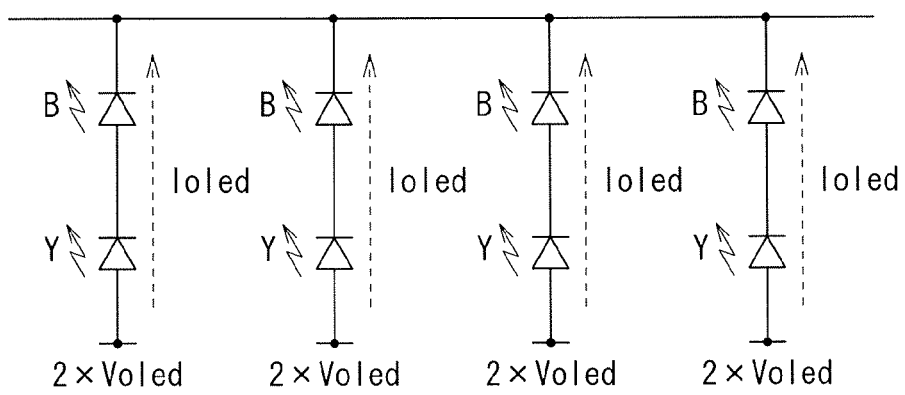
FIG. 12 is a circuit diagram illustrating a connected state of each of light emitting elements illustrated in FIG. 11.

FIG. 12 illustrates power consumption of the pixel PixS. In this exemplary case, for convenience of description, it is assumed that the same potential difference (Vold) is applied across any of the light emitting elements 30S in the pixel PixS, and thus the same current Ioled flows through the individual light emitting elements 30S. At this time, power Power consumed by the pixel PixS is represented by the following Formula (1).

$$Power=8\times Voled \times Ioled \qquad (1)$$

In this way, in the display unit 1S according to the comparative example 2, the yellow light emitting layer 402 and the blue light emitting layer 404 are stacked with the charge generation layer 403 in between, leading to a high drive voltage, 2×Vold. Moreover, in each of the sub-pixels SPixS of red (R), green (G), and blue (B), the yellow light emitting layer 402 and the blue light emitting layer 404 emit white light as synthesized light, and the color filter 406 blocks light of colors other than the desired color. In other words, the yellow light emitting layer 402 and the blue light emitting layer 404 each emit not only light of a desired color but also light of unnecessary colors, leading to waste of power. Consequently, power consumption of the display unit 1S may be large.

Description is now made on power consumption of each pixel Pix of the display unit 1 according to the first embodiment.

Figure 13:
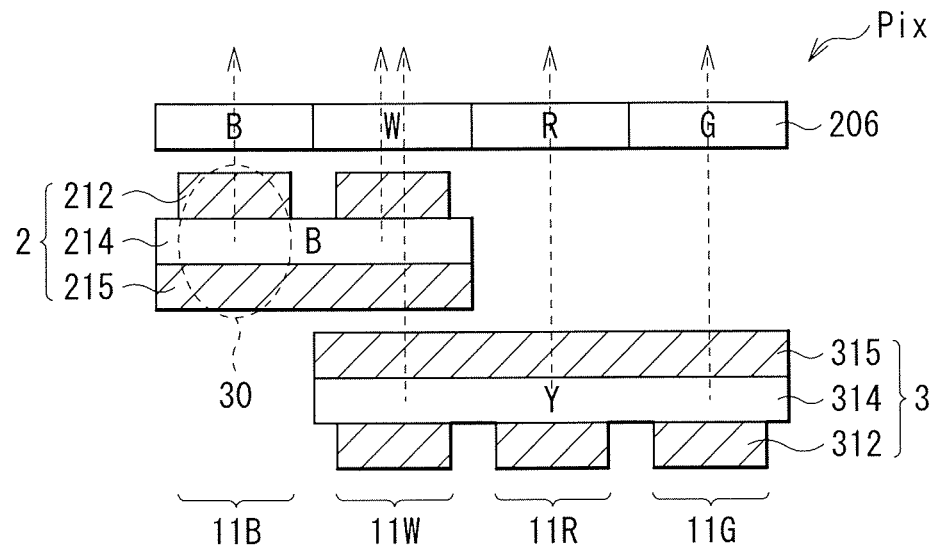
FIG. 13 is a sectional diagram illustrating a schematic sectional structure of a pixel illustrated in FIG. 4.

FIG. 13 schematically illustrates a configuration of the pixel Pix. In the display unit 1, the blue (B) light emitting element 30 is provided in the region corresponding to the sub-pixels 11B and 11W in the upper substrate 2, while the yellow (Y) light emitting element 30 is provided in the region corresponding to the sub-pixels 11R, 11G, and 11W in the lower substrate 3. Consequently, the light emitting elements 30 are driven independently of each other.

Figure 14:
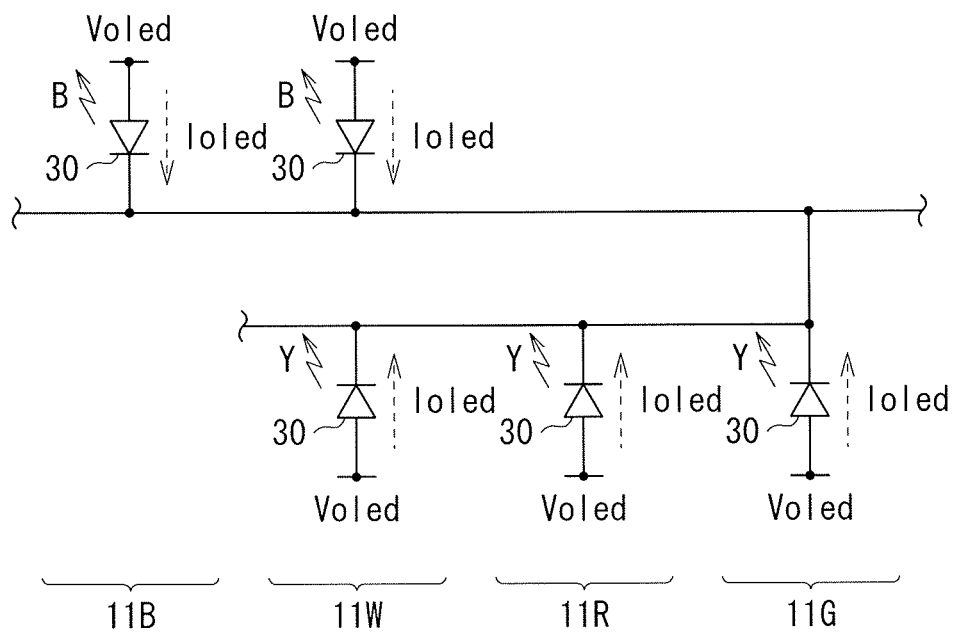
FIG. 14 is a circuit diagram illustrating a connected state of each of light emitting elements illustrated in FIG. 13.

FIG. 14 illustrates power consumption of the pixel Pix. In this exemplary case, as in the case of the comparative example 2, it is assumed that the same potential difference Vold is applied across any of the light emitting elements 30 in the pixel Pix, and thus the same current holed flows through the individual light emitting elements 30. At this time, power Power consumed by the pixel Pix is represented by the following Formula (2).

$$Power=5\times Voled \times Ioled \qquad (2)$$

In other words, this rough estimate shows that the display unit 1 according to the first embodiment allows power consumption to be reduced by five-eighth of that of the display unit 1S according to the comparative example 2 (Formula (1)).

In this way, in the display unit 1 according to the first embodiment, the blue light emitting layer 214 is provided as a single-layer light emitting layer in the upper substrate 2, and the yellow light emitting layer 314 is provided as a single-layer light emitting layer in the lower substrate 3. Consequently, light emission of such light emitting layers is allowed to be independently controlled; hence, a drive voltage is not increased unlike in the case of the comparative example 2 (FIG. 12, etc.). Moreover, in the display unit 1, for example, the yellow light emitting layer 314 emits yellow light in each of the red (R) sub-pixel 11R and the green (G) sub-pixel 11G, while the blue light emitting layer 214 emits blue light in the blue (B) sub-pixel 11B. Consequently, unnecessary light emission is allowed to be more suppressed than in the case of the comparative example 2 (FIG. 12, etc.), leading to reduction in power consumption.

[Effects]

As described above, in the first embodiment, since the blue light emitting layer and the yellow light emitting layer are each uniformly provided in the pixel array, resolution is allowed to be increased.

Moreover, in the first embodiment, the blue light emitting layer is provided as a single-layer light emitting layer in the upper substrate, and the yellow light emitting layer is provided as a single-layer light emitting layer in the lower substrate; hence, power consumption is allowed to be reduced.

Moreover, in the first embodiment, the scan lines in the upper substrate and the scan lines in the lower substrate are connected to each other, and the scan line drive section provided in the bezel region of the upper substrate collectively drives such scan lines. In addition, the power lines in the upper substrate and the power lines in the lower substrate are connected to each other, and the power line drive section provided in the bezel region of the lower substrate collectively drives such power lines. Hence, the bezel regions are allowed to be narrowed.

Moreover, in the first embodiment, the signal lines in the upper substrate are not connected to the signal lines in the lower substrate, and thus the data line drive section is allowed to separately drive such signal lines. Hence, white balance is allowed to be easily adjusted.

[Modification 1-1]

Although the insulating layer 216 is provided in the upper substrate 2, and the insulating layer 316 is provided in the lower substrate 3 in the first embodiment, this is not limitative. Alternatively, for example, as with a display section 10A illustrated in FIG. 15, an upper substrate 2A and a lower substrate 3A may be configured without providing such insulating layers. Specifically, for example, the insulating layers 216 and 316 each functions as a protective layer that suppresses a possibility of degradation in light emitting characteristics of the blue light emitting layer 214 or the yellow light emitting layer 314 due to exposure of the upper substrate 2 or the lower substrate 3 to air. Hence, for example, in the case where the upper substrate 2 fabricated in the upper-substrate fabrication process SA and the lower substrate 3 fabricated in the lower-substrate fabrication process SB are still handled in a vacuum, and the upper substrate 2 and the lower substrate 3 are still bonded together with the bonding material 9 in a vacuum in the manufacturing process illustrated in FIG. 9, the insulating layers 216 and 316 may not be provided.

Figure 15:
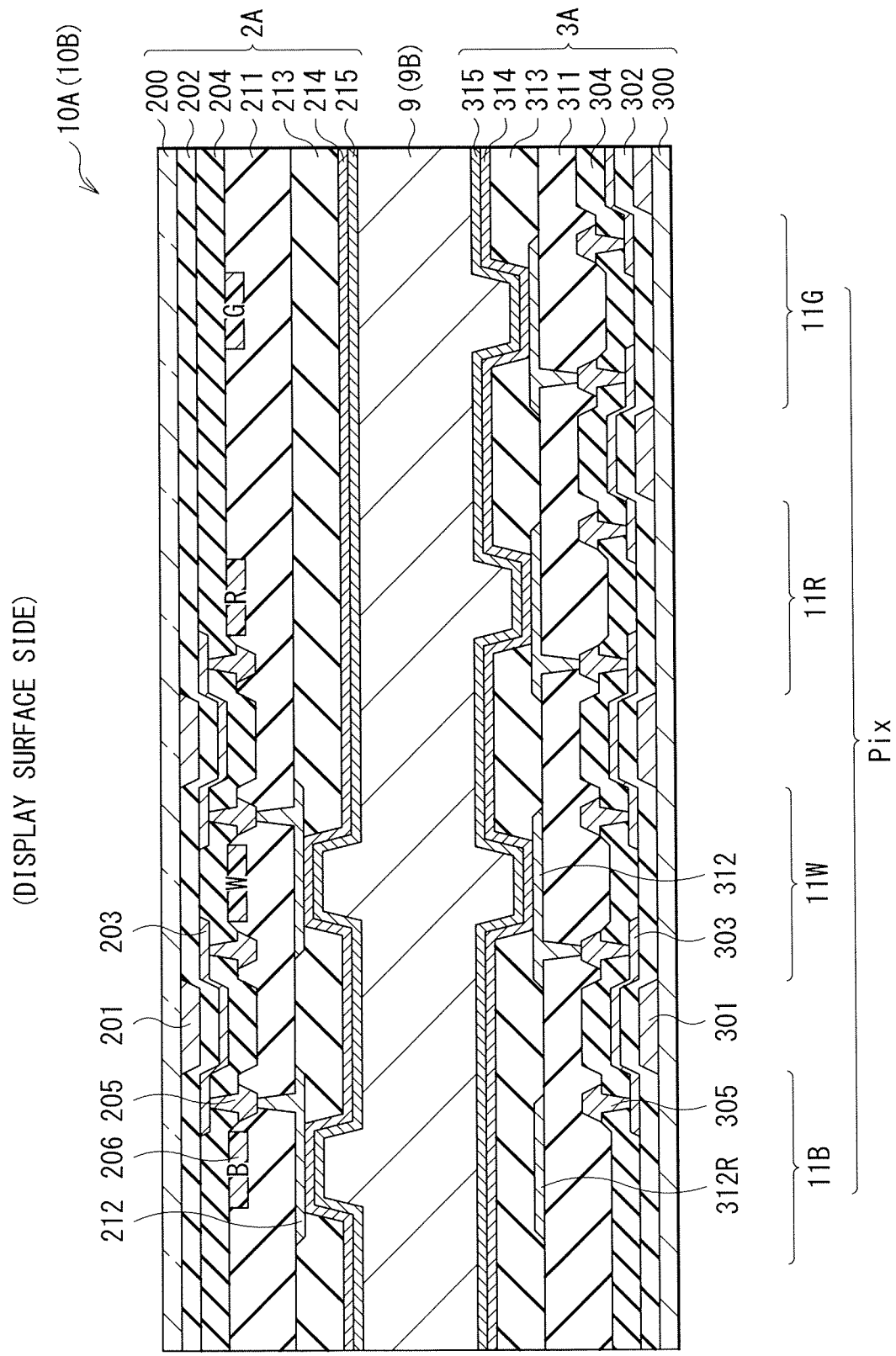
FIG. 15 is a sectional diagram illustrating an exemplary configuration of a display section according to a modification of the first embodiment.

Moreover, for example, as with a display section 10B illustrated in FIG. 15, a conductive bonding material 9B may be used in place of the insulative bonding material 9. Consequently, impedance of each of the cathodes 215 and 315 is allowed to be decreased, and thus a possibility of malfunction due to high impedance of the cathode 215 or 315 is allowed to be reduced.

[Modification 1-2]

The configuration of the color filter 206 in the first embodiment is not limited to the configuration illustrated in FIG. 4. Several modifications of the color filter 206 are described below.

Figure 16:
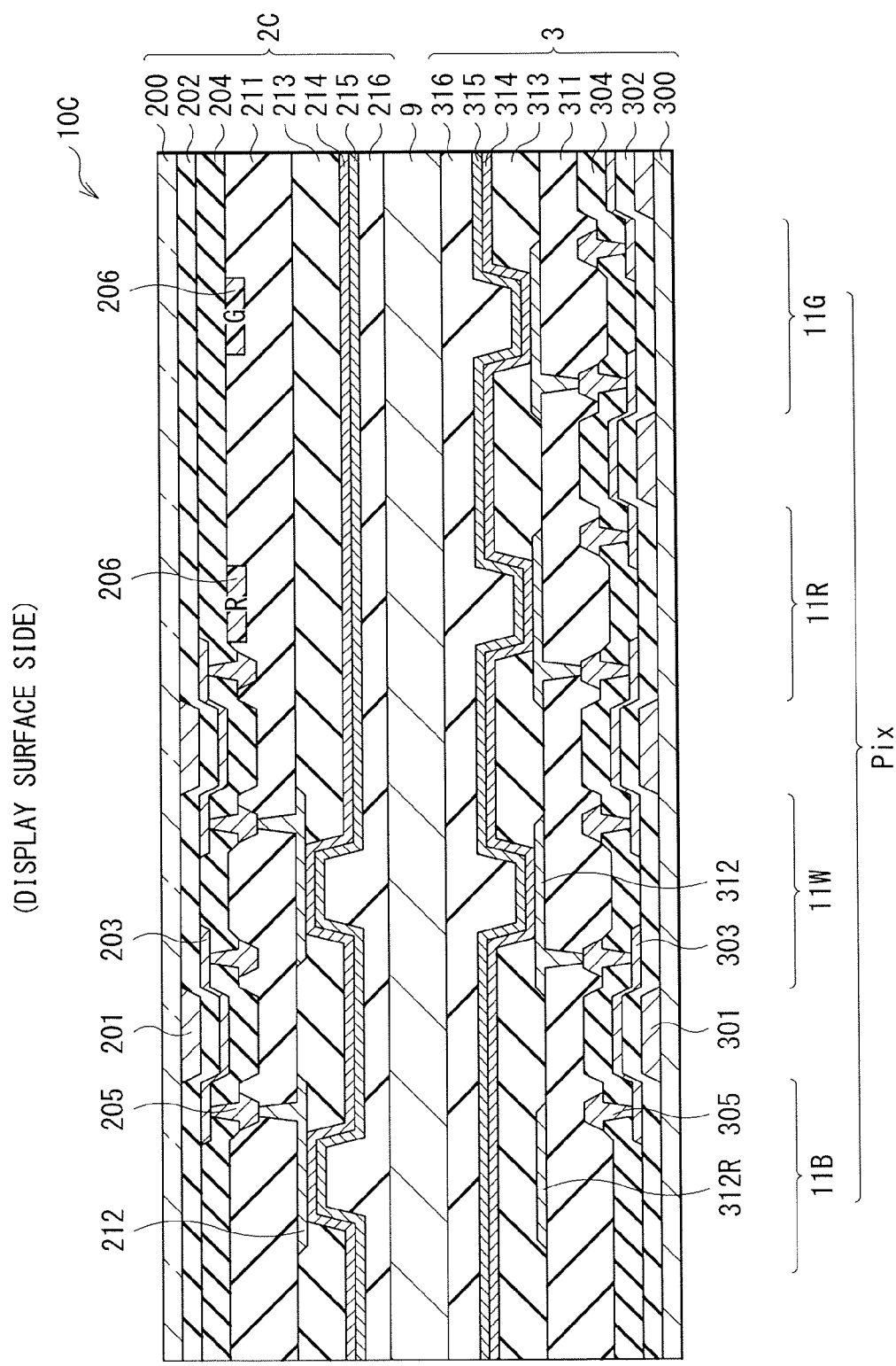
FIG. 16 is a sectional diagram illustrating an exemplary configuration of a display section according to another modification of the first embodiment.

Although a color filter 206 of a corresponding color is provided for each of the sub-pixels 11R, 11G, 11B, and 11W in the first embodiment, this is not limitative. Alternatively, for example, as with a display section 10C illustrated in FIG. 16, the color filter 206 for each of the sub-pixels 11B and 11W may be omitted. Specifically, the blue light emitting layer 214 emits blue light in the sub-pixel 11B, and the blue light emitting layer 214 and the yellow light emitting layer 314 emit white light as synthesized light in the sub-pixel 11W. Hence, the color filter 206 may be omitted from each of the sub-pixels 11B and 11W in an application where a requirement for image quality (a color gamut) is not so high, for example.

Figure 17:
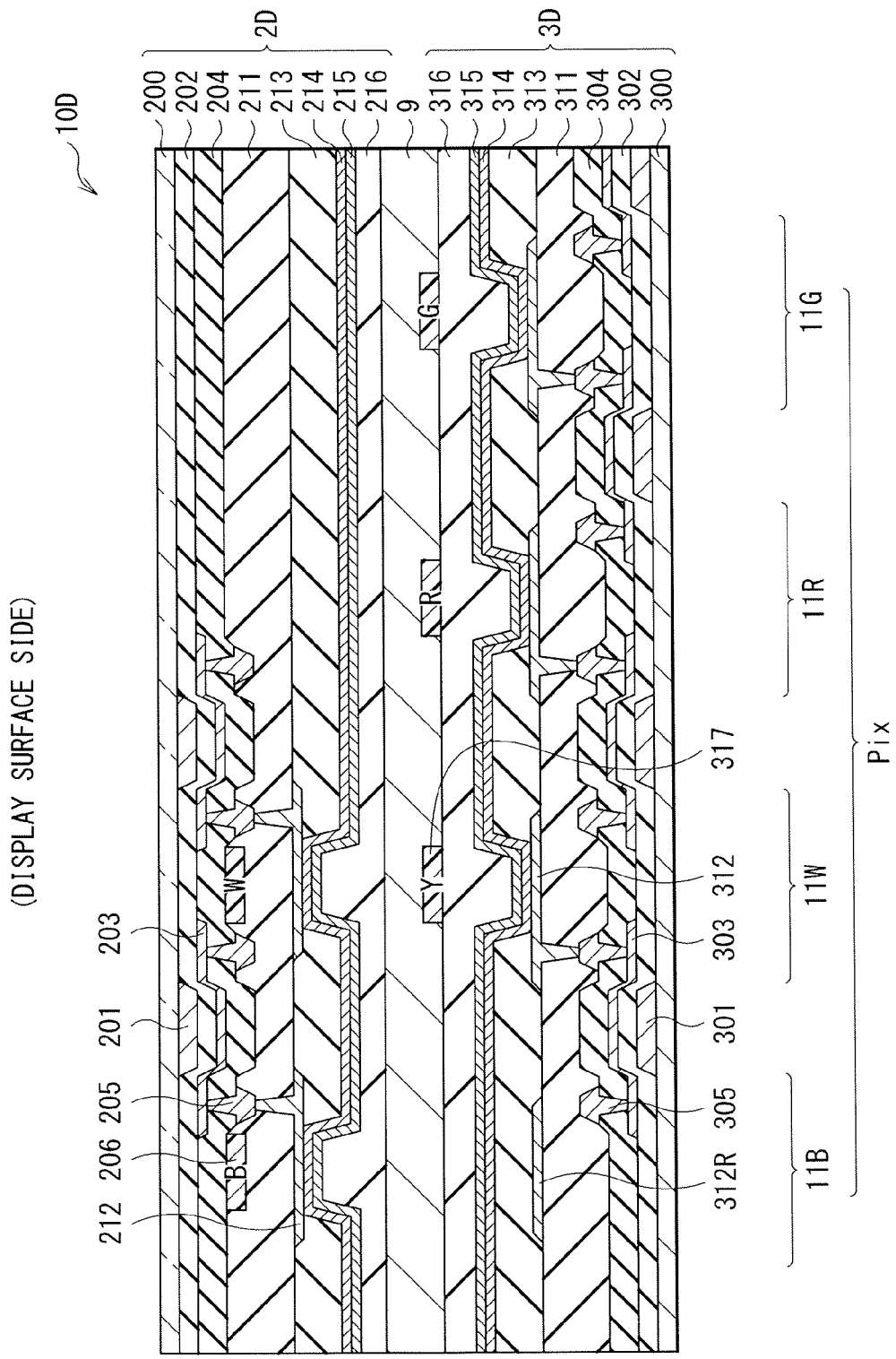
FIG. 17 is a sectional diagram illustrating an exemplary configuration of a display section according to another modification of the first embodiment.
Figure 18:
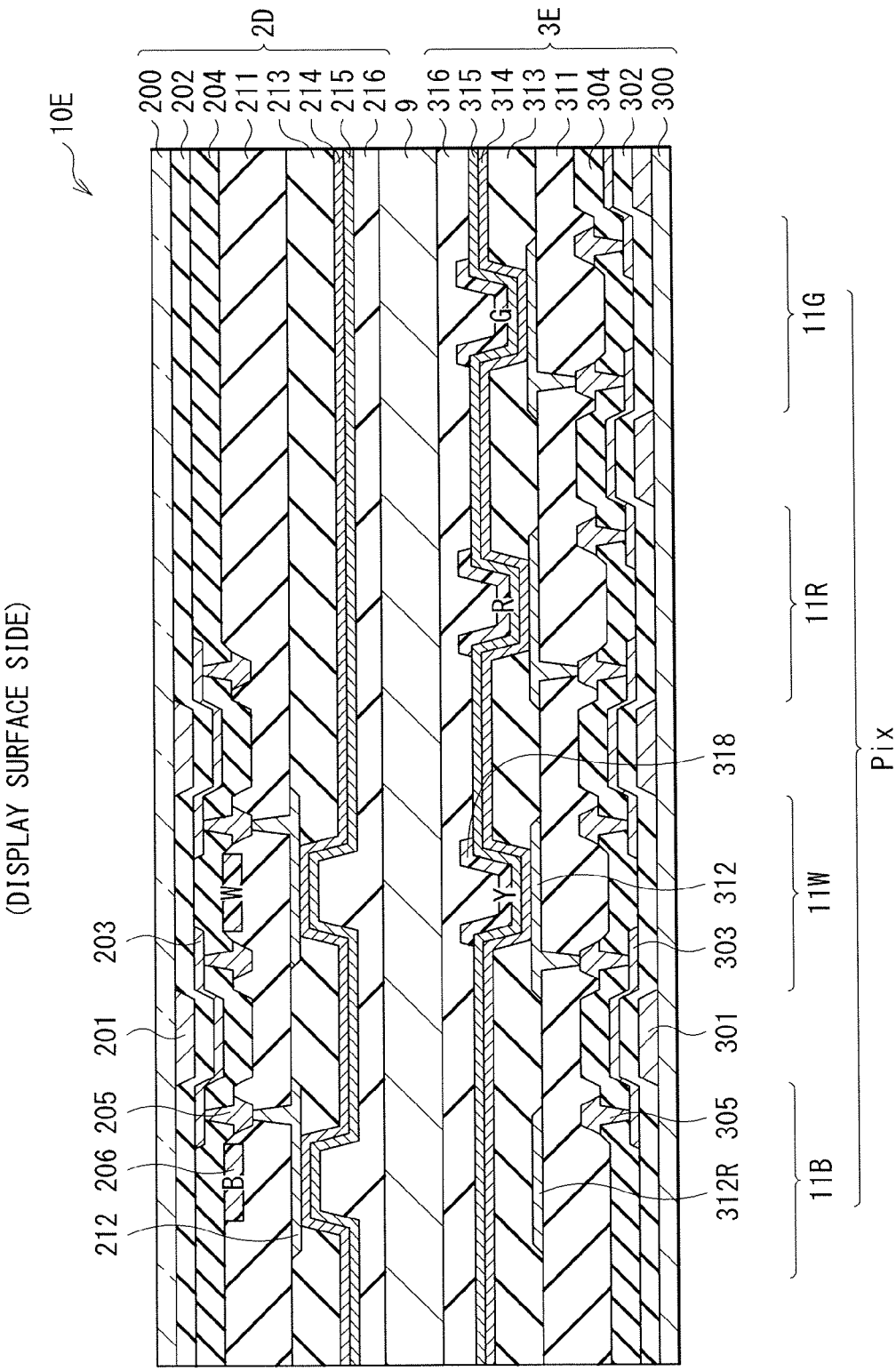
FIG. 18 is a sectional diagram illustrating an exemplary configuration of a display section according to another modification of the first embodiment.

Although the color filters 206 are provided only in the upper substrate 2 in the first embodiment, this is not limitative. For example, as illustrated in FIGS. 17 and 18, color filters of red (R) and green (G) may be omitted from an upper substrate 2D, while color filters of red (R), green (G), and yellow (Y) may be provided in a lower substrate 3D. In an exemplary case (display section 10D) of FIG. 17, color filters 317 of red (R), green (G), and yellow (Y) are provided on the insulating layer 316 in the lower substrate 3D. In an exemplary case (display section 10E) of FIG. 18, color filters 318 of red (R), green (G), and yellow (Y) are provided on the cathode electrode 315 in a lower substrate 3E.

Figure 19:
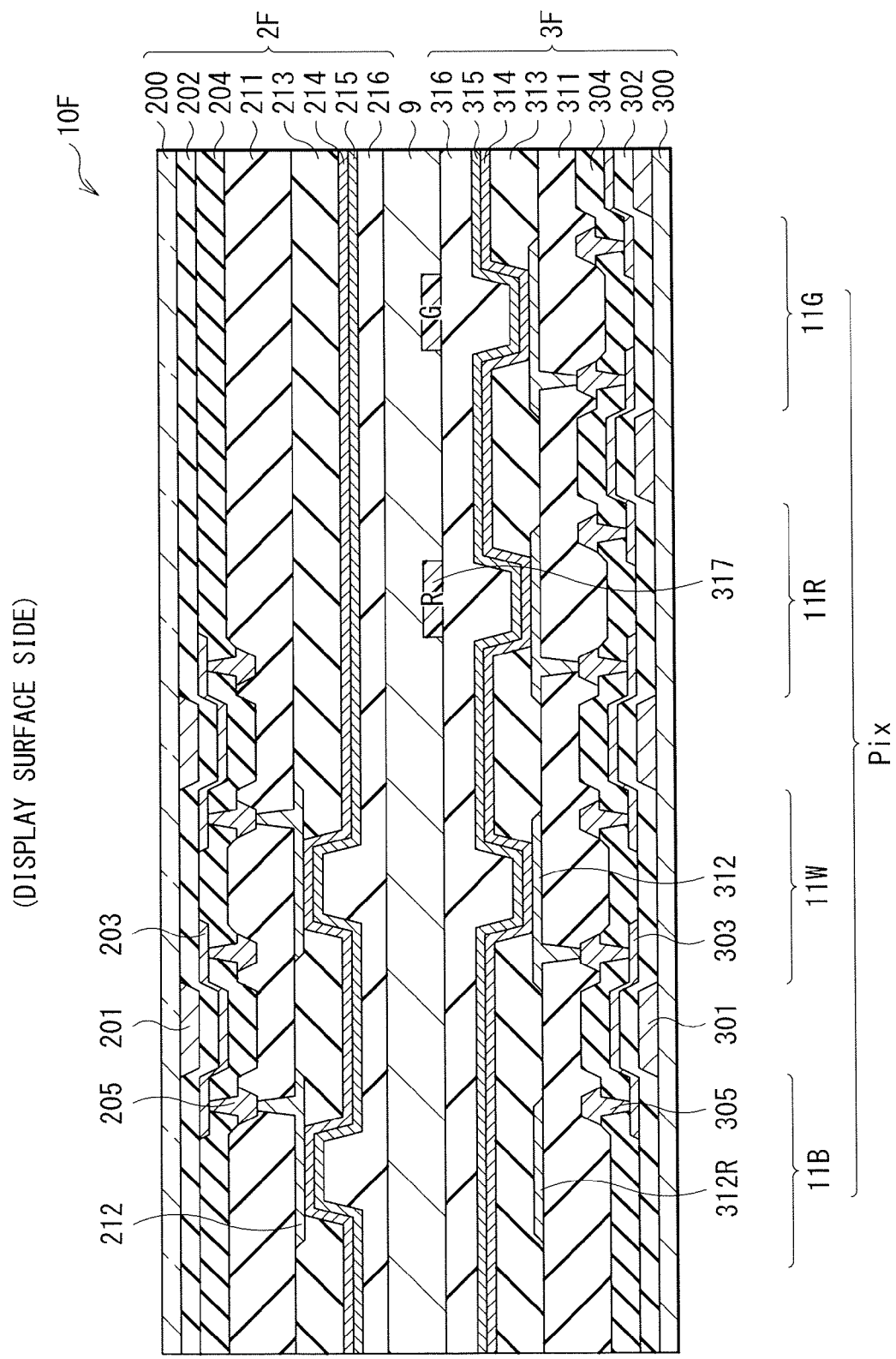
FIG. 19 is a sectional diagram illustrating an exemplary configuration of a display section according to another modification of the first embodiment.

In the case where the color filters are provided in the lower substrate as illustrated in FIGS. 17 and 18, the color filters 206 of blue (B) and white (W) in the upper substrate 2D may be omitted. FIG. 19 illustrates a display section 10F that is provided through application of such a modification to the configuration of FIG. 17. In this case, a yellow (Y) color filter 317 in the lower substrate 3D is also omitted. Consequently, a color-filter formation step is allowed to be omitted in a fabrication step of an upper substrate 2F, making it possible to more simplify a manufacturing process.

Figure 20:
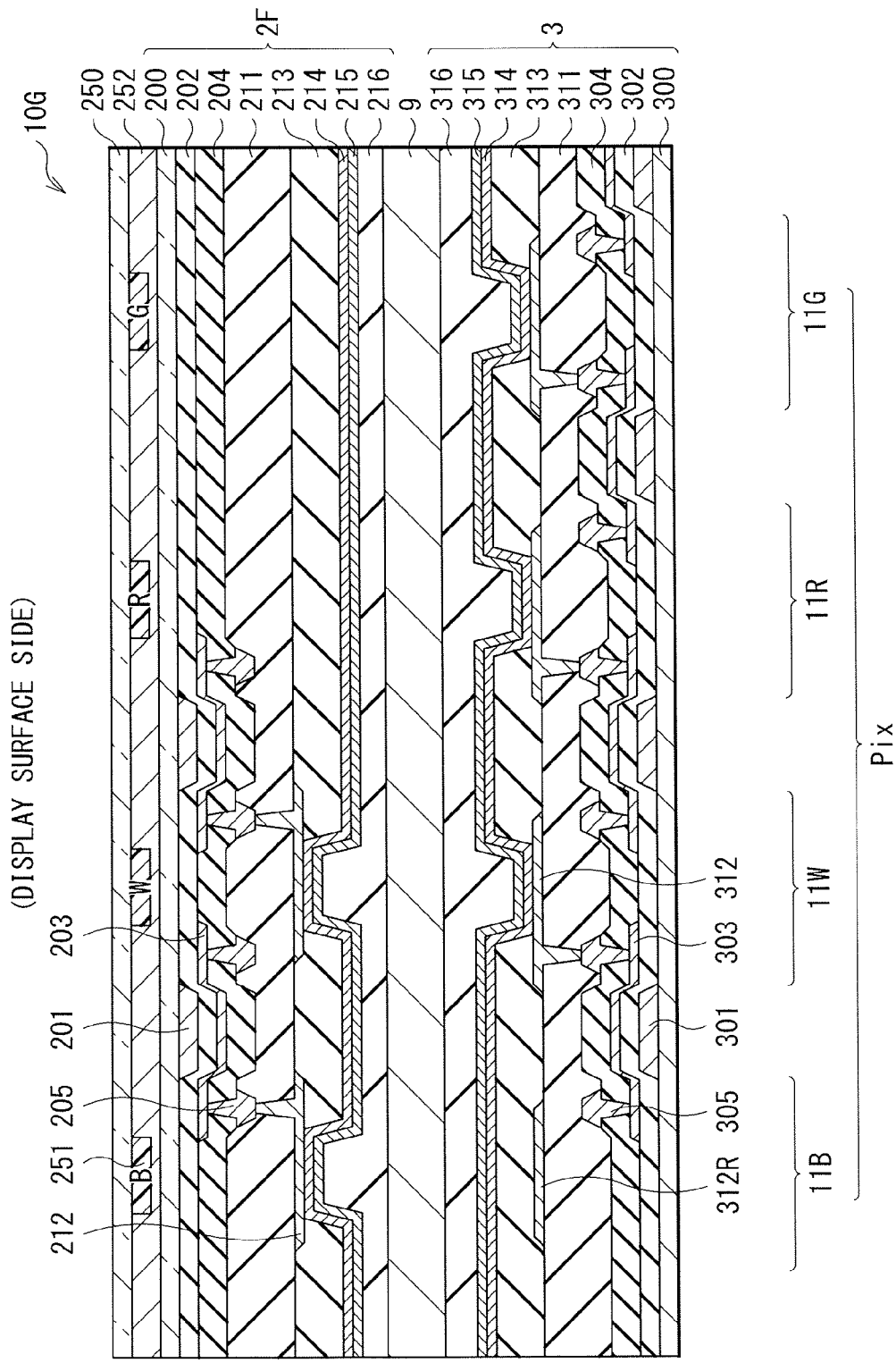
FIG. 20 is a sectional diagram illustrating an exemplary configuration of a display section according to another modification of the first embodiment.

As with a display section 10G illustrated in FIG. 20, color filters may be provided in a layer different from the upper substrate 2 and the lower substrate 3. In this exemplary case, a transparent substrate 250 having color filters 251 thereon is bonded to a display surface side of an upper substrate 2F by a bonding material 252. For example, the transparent substrate 250 may be formed of glass, plastic, or the like. The bonding material 252 is formed of a transparent resin.

[Modification 1-3]

Figure 21:
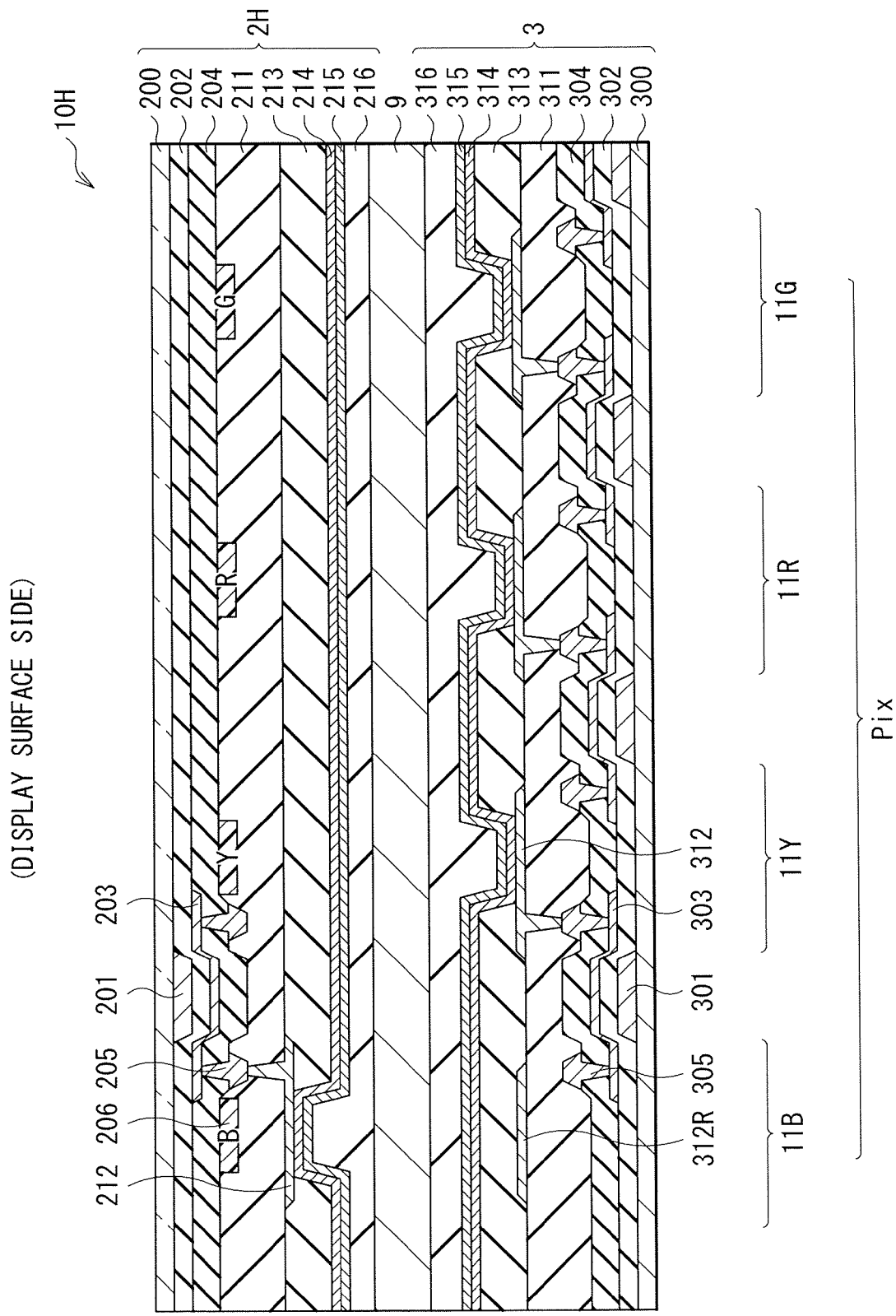
FIG. 21 is a sectional diagram illustrating an exemplary configuration of a display section according to another modification of the first embodiment.
Figure 22:
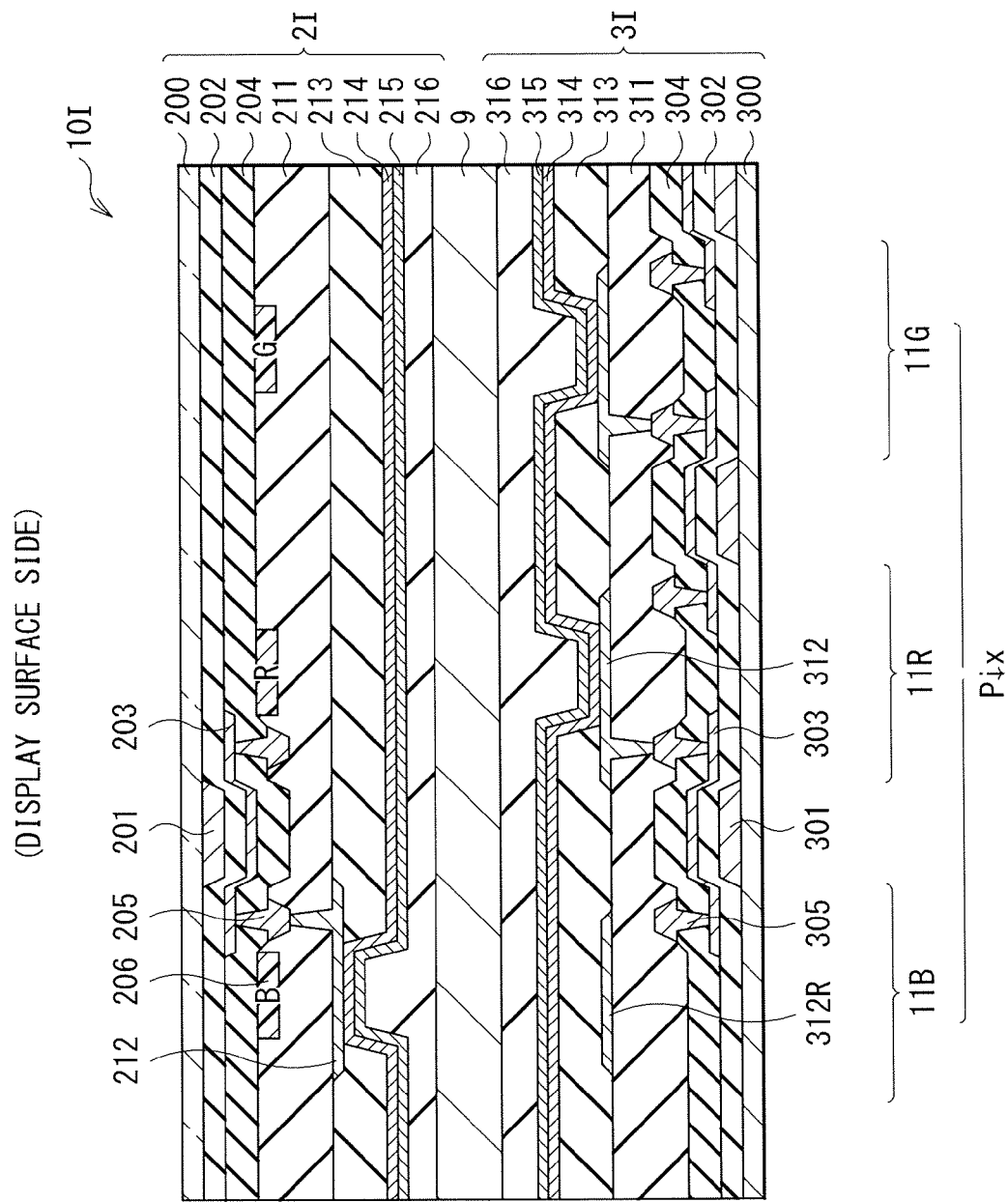
FIG. 22 is a sectional diagram illustrating an exemplary configuration of a display section according to another modification of the first embodiment.

Although the pixel Pix is configured of the four sub-pixels 11R, 11G, 11B, and 11W of red, green, blue, and white, respectively, in the first embodiment, this is not limitative. Alternatively, for example, as with a display section 10H illustrated in FIG. 21, the pixel Pix may be configured of four sub-pixels 11R, 11G, 11B, and 11Y of red (R), green (G), blue (B), and yellow (Y), respectively. Alternatively, as a display section 10I illustrated in FIG. 22, the pixel Pix may be configured of three sub-pixels 11R, 11G, and 11B of red (R), green (G), and blue (B), respectively. In each case, effects similar to those of the first embodiment are obtained.

[Modification 1-4]

Figure 23:
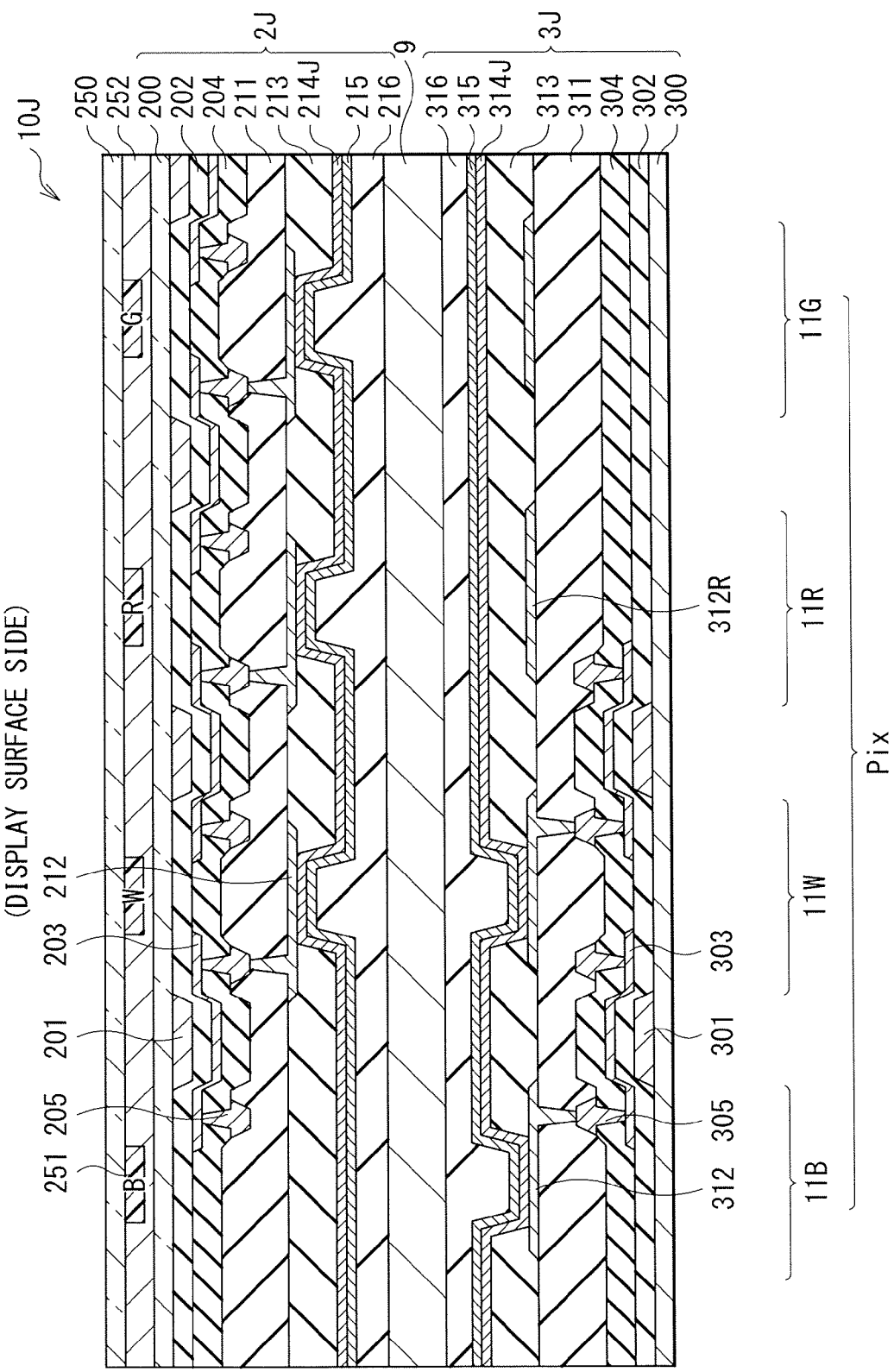
FIG. 23 is a sectional diagram illustrating an exemplary configuration of a display section according to another modification of the first embodiment.

Although the blue light emitting layer 214 is provided in the upper substrate 2, and the yellow light emitting layer 314 is provided in the lower substrate 3 in the first embodiment, this is not limitative. Alternatively, for example, as with a display section 10J illustrated in FIG. 23, a yellow light emitting layer 214J may be provided in an upper substrate 2J, and a blue light emitting layer 314J may be provided in a lower substrate 3J. Although the display section 10J is provided through application of Modification 1-4 to the display section 10G (FIG. 20), this is not limitative. Modification 1-4 may be applied to any other display section.

[Modification 1-5]

Although the blue light emitting layer 214 that emits blue light is provided in the upper substrate 2, and the yellow light emitting layer 314 that emits light of yellow as a complementary color of blue is provided in the lower substrate 3 in the first embodiment, this is not limitative. For example, a red light emitting layer that emits red light may be provided in the upper substrate 2, and a cyan light emitting layer that emits light of cyan as a complementary color of red may be provided in the lower substrate 3. Alternatively, for example, a green light emitting layer that emits green light may be provided in the upper substrate 2, and a magenta light emitting layer that emits light of magenta as a complementary color of green may be provided in the lower substrate 3.

[Modification 1-6]

Figure 24:
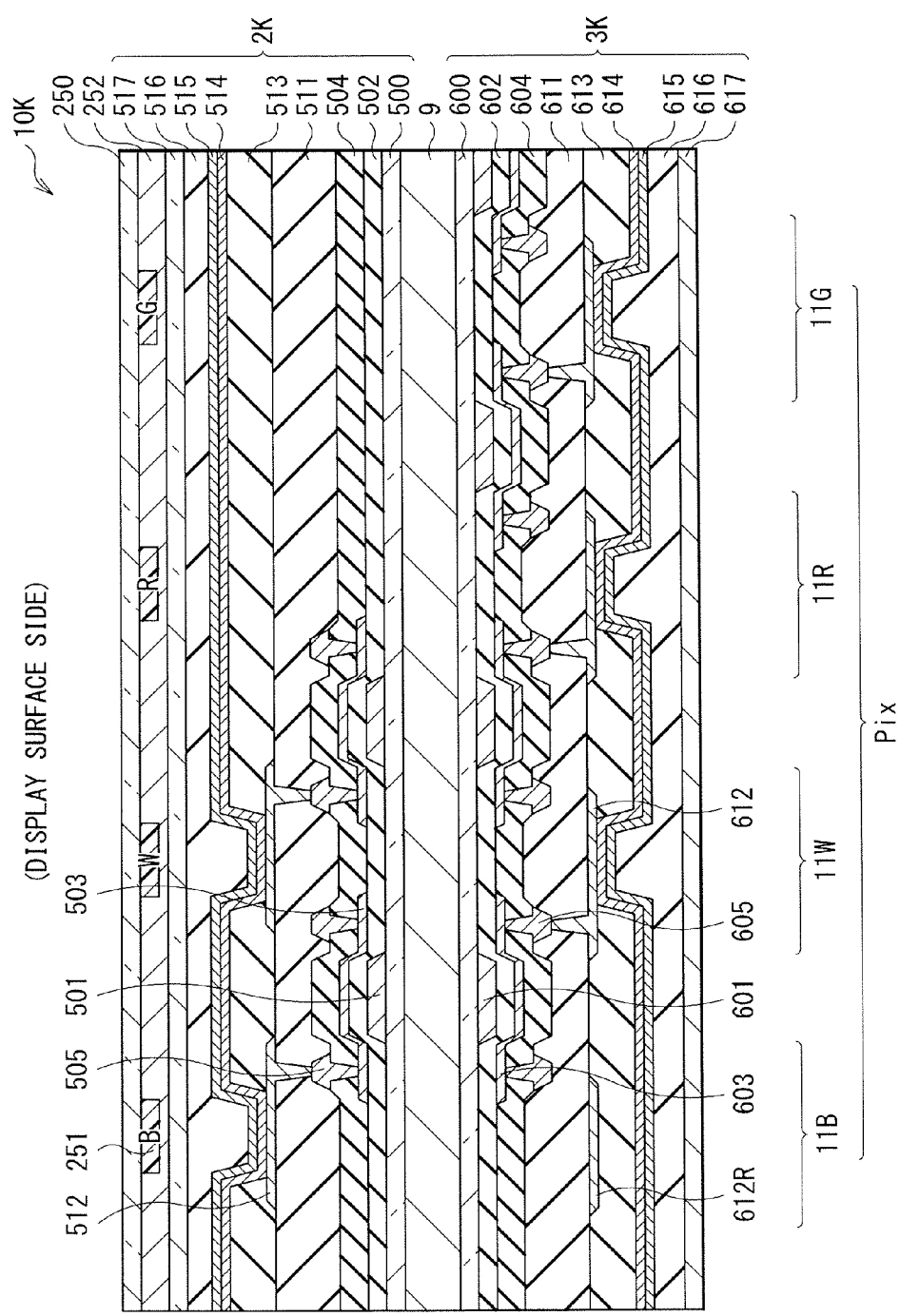
FIG. 24 is a sectional diagram illustrating an exemplary configuration of a display section according to another modification of the first embodiment.

Although the light emitting element of a bottom emission type is provided in the upper substrate 2, and the light emitting element of a top emission type is provided in the lower substrate 3 in the first embodiment, this is not limitative, and any combination of light-emitting element types may be used. For example, as with a display section 10K illustrated in FIG. 24, a light emitting element of a top emission type may be provided in an upper substrate 2K, and a light emitting element of a bottom emission type may be provided in a lower substrate 3K. Alternatively, a light emitting element of a top emission type may be provided in each of the upper and lower substrates, or a light emitting element of a bottom emission type may be provided in each of the upper and lower substrates.

2. Second Embodiment

A display unit 5 according to a second embodiment is now described. In the second embodiment, the opening is formed smaller in the lower substrate than in the upper substrate. It is to be noted that substantially the same components as those of the display unit 1 according to the first embodiment are designated by the same numerals, and description of them is appropriately omitted.

As illustrated in FIG. 1, the display unit 5 according to the second embodiment includes a display section 50. Other configurations are similar to those of the display unit 1 and the like.

Figure 25:
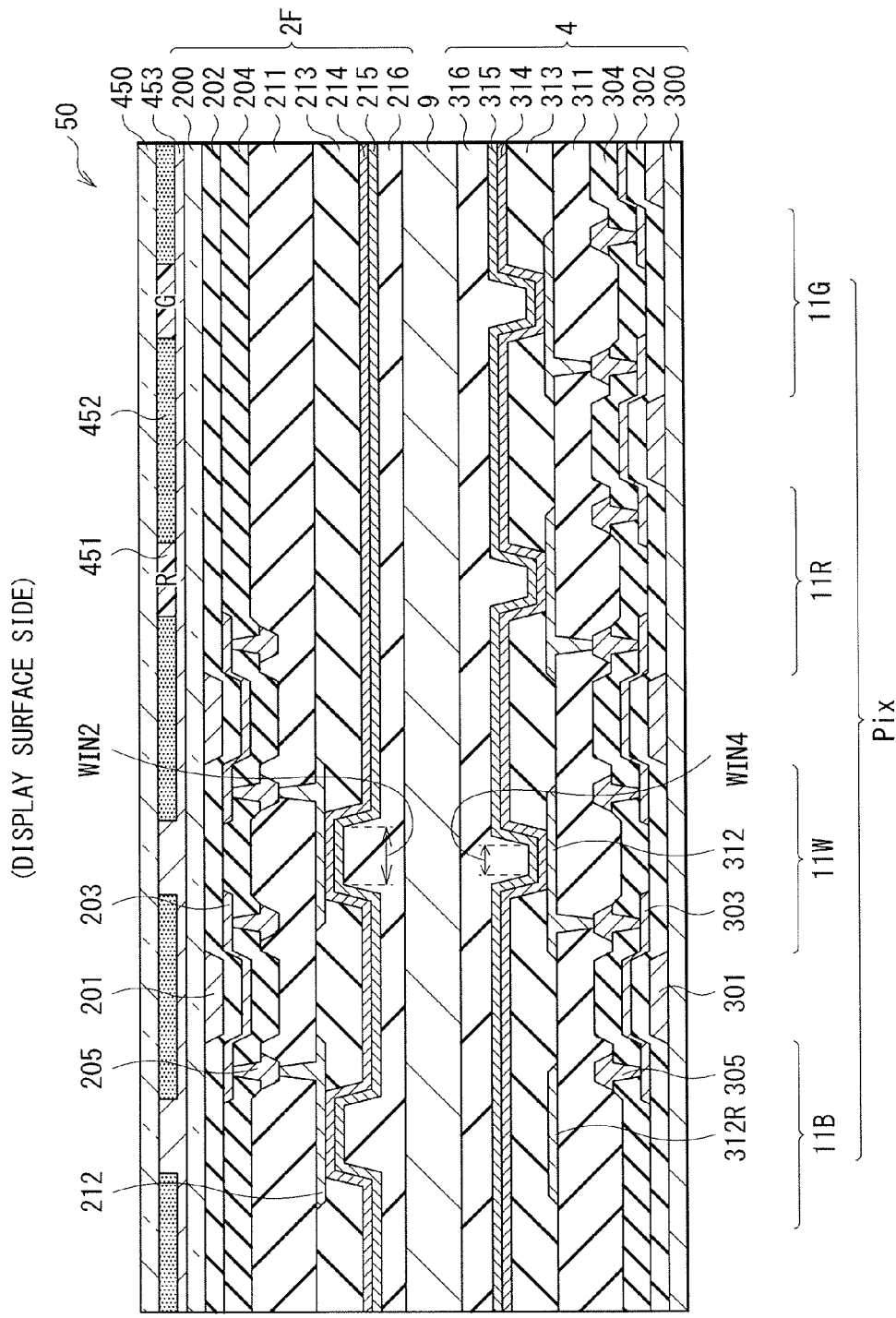
FIG. 25 is a sectional diagram illustrating an exemplary configuration of a display section according to a second embodiment.

FIG. 25 illustrates a sectional diagram of the display section 50. The display section 50 includes an upper substrate 2F, a lower substrate 4, color filters 451, and a black matrix 452. In the lower substrate 4, an opening WIN4 of the yellow light emitting layer 314 is formed smaller than the opening WIN2 of the blue light emitting layer 214 in the upper substrate 2F. Specifically, although size of the opening WIN3 in the lower substrate 3 is substantially the same as size of the opening WIN2 in the upper substrate 2 in the display section 10 according to the first embodiment, the opening WIN4 in the lower substrate 4 is smaller than the opening WIN2 in the upper substrate 2F in the display section 50 according to the second embodiment. In this exemplary case, the data line drive section 27, etc. adjusts white balance in consideration of such a difference in size between the openings WIN2 and WIN4.

The black matrix 452 is provided between sub-pixels 11 adjacent to each other in the same layer as that of the color filters 451. In this exemplary case, for convenience of description, color filters for the sub-pixels 11B and 11W are omitted, and the color filter 451 are provided only for the sub-pixels 11R and 11G.

In this way, in the display section 50, the opening WIN4 in the lower substrate 4 is smaller than the opening WIN2 in the upper substrate 2F. This makes it possible to reduce a possibility of variation in chromaticity depending on an observation angle of a viewer as described below, and thus makes it possible to expand a so-called chromaticity viewing angle.

Figure 26A:
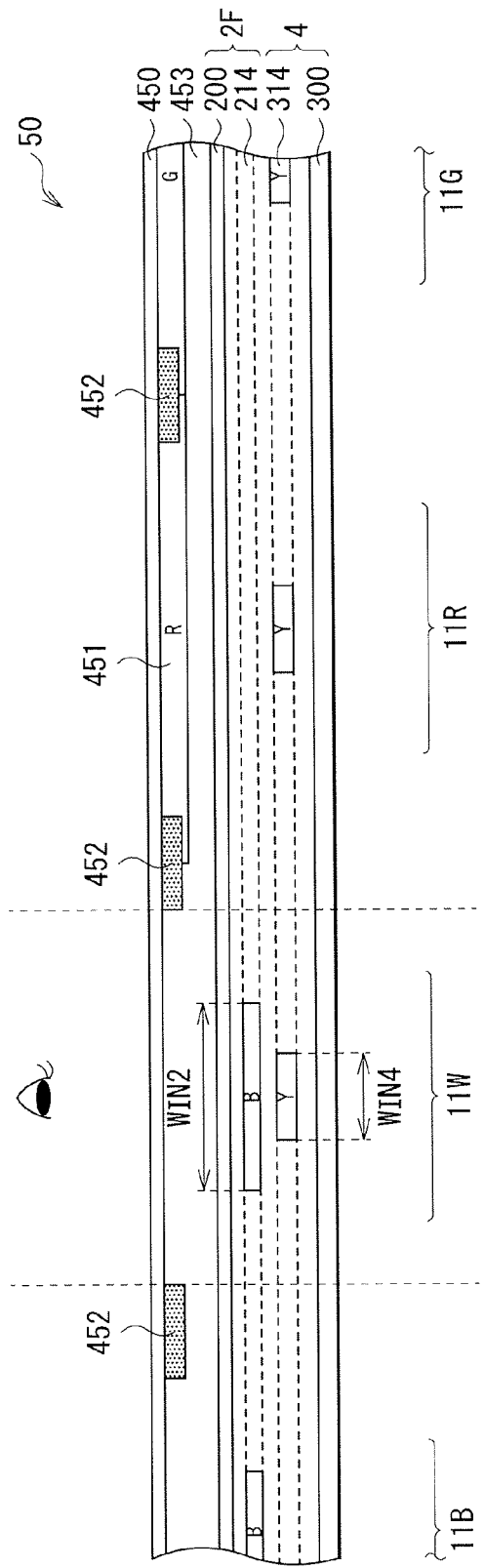
FIG. 26A is a schematic diagram illustrating an exemplary operation of the display section illustrated in FIG. 25.
Figure 26B:
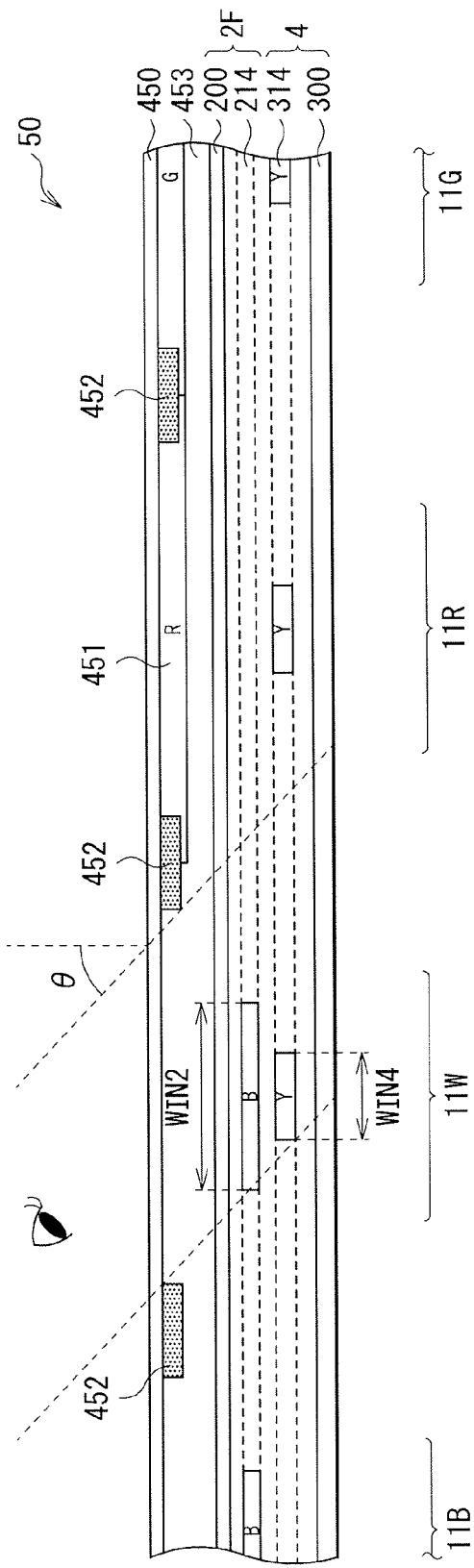
FIG. 26B is a schematic diagram illustrating another exemplary operation of the display section illustrated in FIG. 25.

FIG. 26A illustrates vision of light by a viewer when the viewer observes the display section 50 from the front of the display section 50. FIG. 26B illustrates vision of light by a viewer when the viewer observes the display section 50 in a direction offset by an observation angle θ from the front of the display section 50. In each of the case of observation of the white (W) sub-pixel 11W from the front (FIG. 26A) and the case of observation thereof at the observation angle θ (FIG. 26B), a viewer is allowed to view the entire region of the blue light emitting layer 214 in the opening WIN2 and the entire region of the yellow light emitting layer 314 in the opening WIN4. Consequently, the viewer is allowed to observe a white color.

Subsequently, functions of the second embodiment are described with a comparative example. In a display section 50R according to a comparative example 3, size of the opening WIN3 in the lower substrate is equal to size of the opening WIN2 in the upper substrate.

Figure 27A:
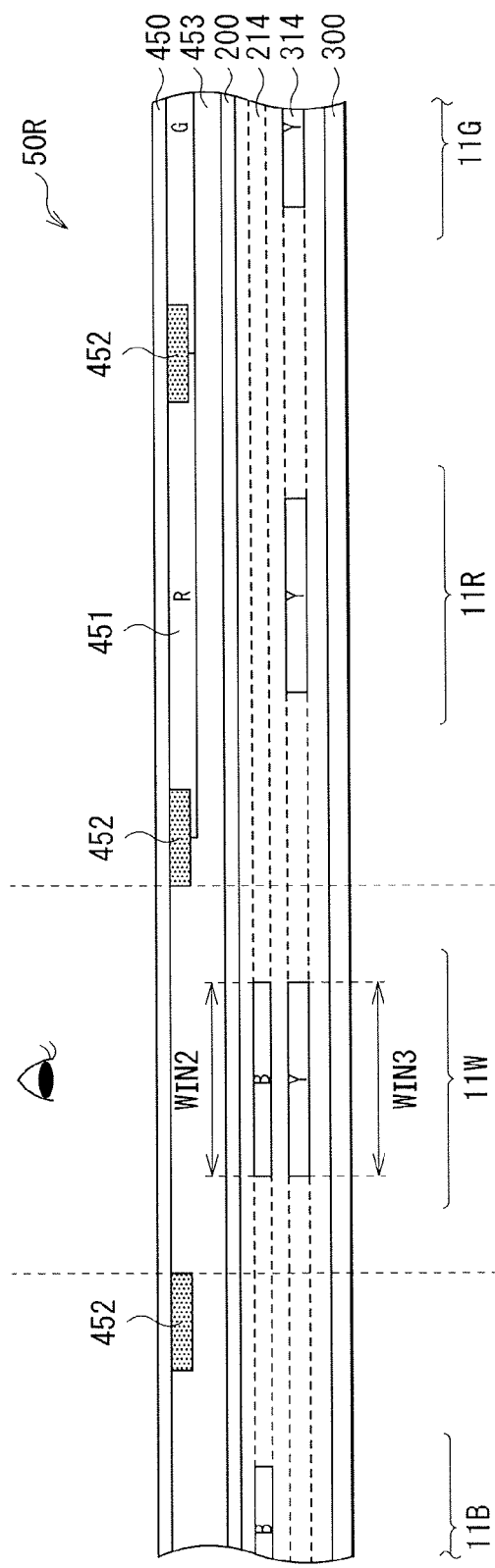
FIG. 27A is a schematic diagram illustrating an exemplary operation of a display section according to a comparative example of the second embodiment.
Figure 27B:
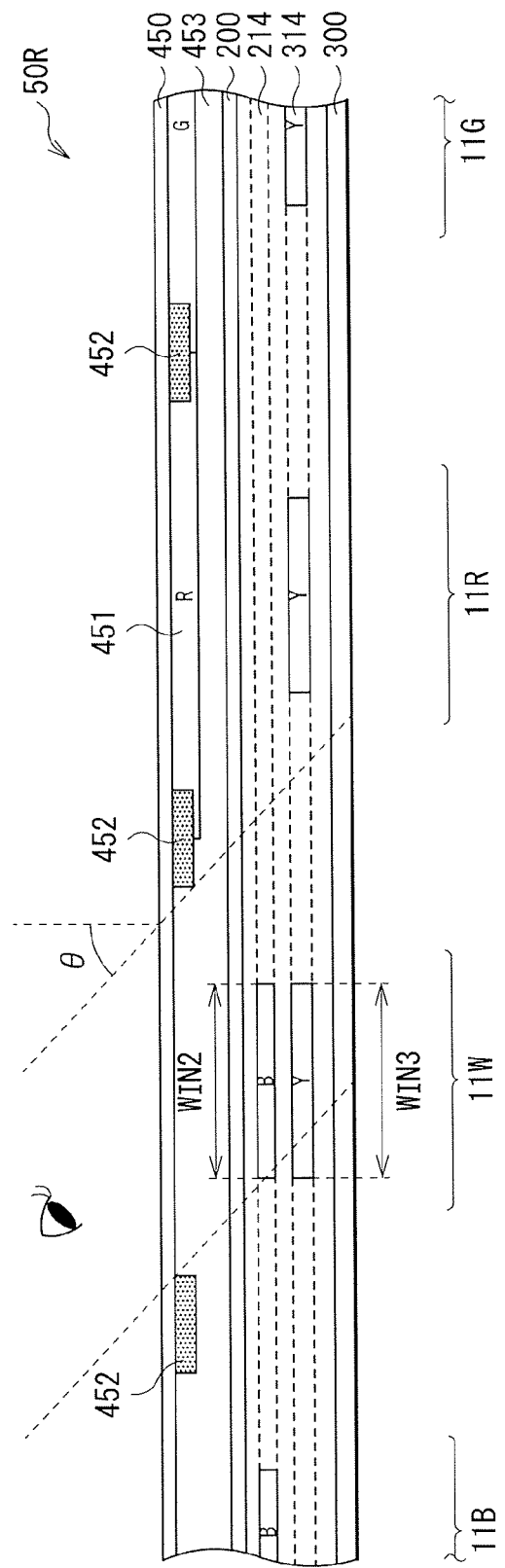
FIG. 27B is a schematic diagram illustrating another exemplary operation of the display section according to the comparative example of the second embodiment.

FIG. 27A illustrates vision of light by a viewer when the viewer observes the display section 50R from the front of the display section 50R. FIG. 27B illustrates vision of light by a viewer when the viewer observes the display section 50R in a direction offset by an observation angle θ from the front of the display section 50R. As illustrated in FIG. 27A, when the viewer observes the white (W) sub-pixel 11W from the front, the viewer is allowed to view the entire region of the blue light emitting layer 214 through the opening WIN2 and the entire region of the yellow light emitting layer 314 through the opening WIN3. Consequently, the viewer is allowed to observe a white color. On the other hand, as illustrated in FIG. 27B, when the viewer observes the white (W) sub-pixel 11W at the observation angle θ, the viewer is allowed to view the entire region of the blue light emitting layer 214 through the opening WIN2, but is not allowed to view the entire region of the yellow light emitting layer 314 through the opening WIN3 since part of the region thereof is blocked by the black matrix 452. In this case, therefore, the viewer observes a slightly bluish white color in the case of observation at the observation angle θ compared with in the case of observation from the front.

In this way, in the display section 50R according to the comparative example 3, chromaticity may be varied depending on an observation angle. In other words, an observation angle range, in which chromaticity is not varied, is narrowed, and thus the chromaticity viewing angle may be narrowed.

In contrast, in the display section 50 according to the second embodiment, the opening WIN4 in the lower substrate 4 is smaller than the opening WIN2 in the upper substrate 2F, which makes it possible to reduce a possibility of variation in chromaticity depending on an observation angle as illustrated in FIGS. 26A and 26B. In other words, the display section 50 allows the observation angle range, in which chromaticity is not varied, to be expanded, and thus allows the chromaticity viewing angle to be expanded.

Although this exemplary case has been described, for convenience of description, with a case where color filters for the sub-pixels 11B and 11W are omitted, and the color filter 451 are provided only for the sub-pixels 11R and 11G, the color filter 451 may also be provided for the sub-pixels 11B and 11W. In such a case, the chromaticity viewing angle is also expanded.

As described above, in the second embodiment, since the opening in the lower substrate is made smaller than the opening in the upper substrate, the chromaticity viewing angle is allowed to be expanded. Other effects are similar to those in the first embodiment.

[Modification 2-1]

The configuration of the second embodiment is not limited to the configuration illustrated in FIG. 25. Alternatively, for example, the opening in the lower substrate may be made smaller than the opening in the upper substrate in any one of the configurations of the first embodiment and the modifications thereof.

3. Third Embodiment

A display unit 8 according to a third embodiment is now described. In the third embodiment, a light-shielding section is provided between sub-pixels 11 adjacent to each other. It is to be noted that substantially the same components as those of the display unit 1 according to the first embodiment are designated by the same numerals, and description of them is appropriately omitted.

As illustrated in FIG. 1, the display unit 8 according to the third embodiment includes a display section 80. Other configurations are similar to those of the display unit 1 and the like.

Figure 28:
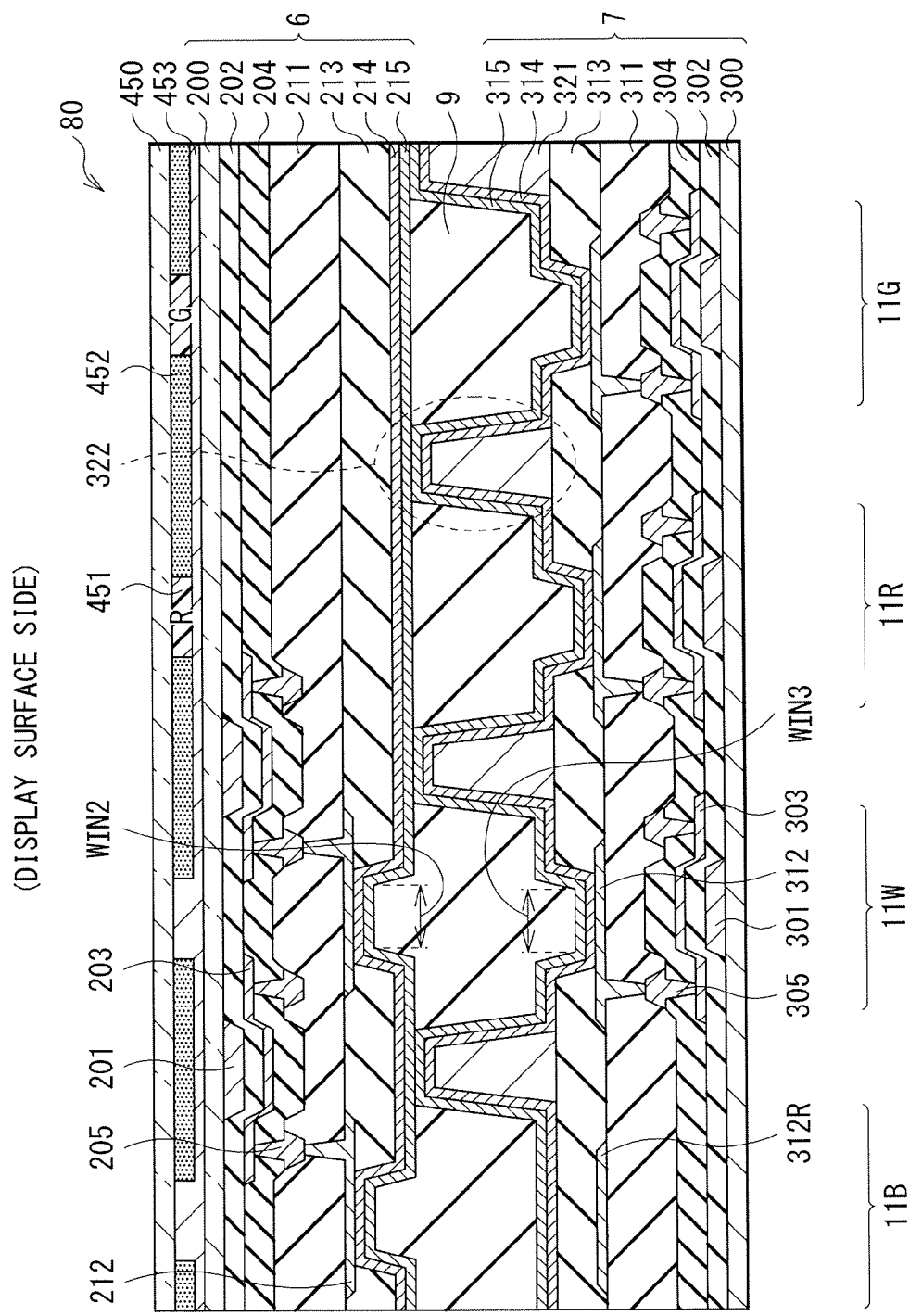
FIG. 28 is a sectional diagram illustrating an exemplary configuration of a display section according to a third embodiment.

FIG. 28 illustrates a sectional diagram of the display section 80. The display section 80 includes an upper substrate 6, a lower substrate 7, and color filters 451. The upper substrate 6 is provided through omitting the insulating layer 216 from the upper substrate 2F. In other words, the cathode 215 is exposed in the upper substrate 6. The lower substrate 7 has light-shielding sections 321. The light-shielding sections 321 are provided on the insulating layer 313. For example, the light-shielding section 321 may be formed of polyimide, acrylic resin, novolac resin, or the like. As described later, the light-shielding section 321 is so baked as to have a lower light transmittance. The yellow light emitting layer 314 is uniformly provided on the insulating layer 313 and the light-shielding sections 321, and the cathode 315 is provided on the yellow light emitting layer 314. In other words, the cathode 315 has a projecting portion 322 in a region corresponding to each light-shielding section 321. The cathode 315 is in contact with the cathode 215 in the upper substrate 6 through bonding of the upper substrate 6 and the lower substrate 7. Consequently, impedance of each of the cathodes 215 and 315 is allowed to be decreased, and thus a possibility of malfunction caused by high impedance of the cathode 215 or 315 is allowed to be reduced.

Figure 29:
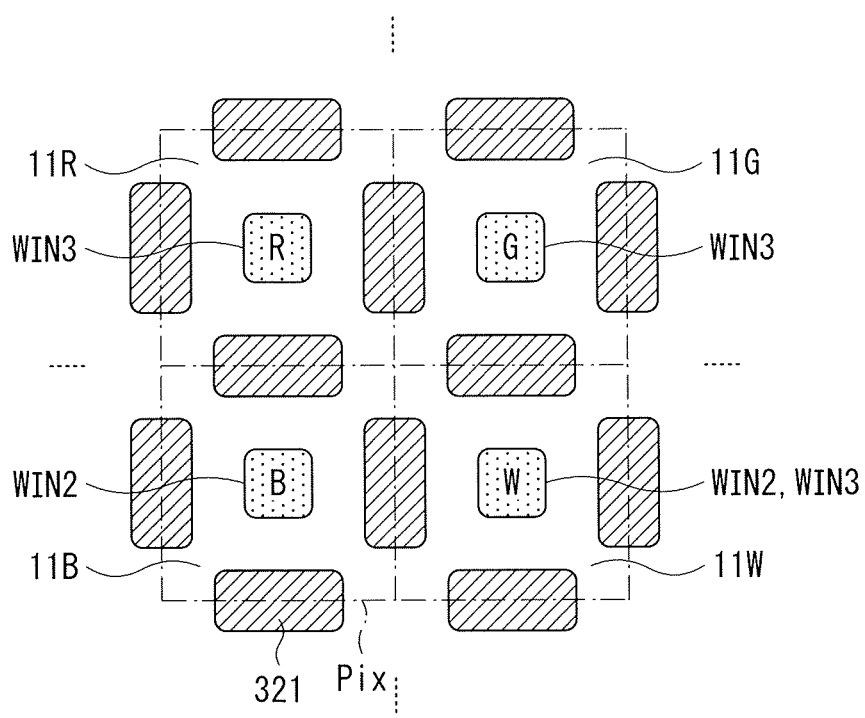
FIG. 29 is a plan diagram illustrating an exemplary layout of light-shielding sections illustrated in FIG. 28.

FIG. 29 illustrates a layout of the light-shielding sections 321 in the pixel Pix. The light-shielding section 321 is provided in the neighborhood of a boundary of sub-pixels 11 adjacent to each other in a horizontal direction (lateral direction), and is provided in the neighborhood of a boundary of sub-pixels 11 adjacent to each other in a vertical direction (longitudinal direction). In other words, the light-shielding sections 321 are so provided as to partially enclose each light emitting region (the opening WIN2 or WIN3), but are each not provided in the neighborhood of four corners of each of the sub-pixels 11. Consequently, when the upper substrate 6 is bonded to the lower substrate 7, the bonding material 9 is allowed to flow beyond a region of the sub-pixel 11. Specifically, for example, when the light-shielding sections 321 enclose the light emitting region (the opening WIN2 or WIN3) in all directions, and when the upper substrate 6 is bonded to the lower substrate 7, the bonding material 9 may be retained in the sub-pixel 11, and thus a void may be partially formed. In such a case, bonding strength may be decreased. Furthermore, image quality may be degraded through scattering of light by the void. In contrast, in the display section 80, since the light-shielding sections 321 partially enclose the light emitting region (the opening), the bonding material 9 flows beyond the region of the sub-pixel 11. This makes it possible to reduce a possibility of retention of the bonding material 9 in the sub-pixel 11; hence, reduction in bonding strength, etc. is allowed to be prevented.

In this way, in the display section 80, the light-shielding section 321 is provided between the sub-pixels 11, and thus a possibility of occurrence of optical color mixing due to the sub-pixels 11 adjacent to each other is allowed to be reduced.

Figure 30:
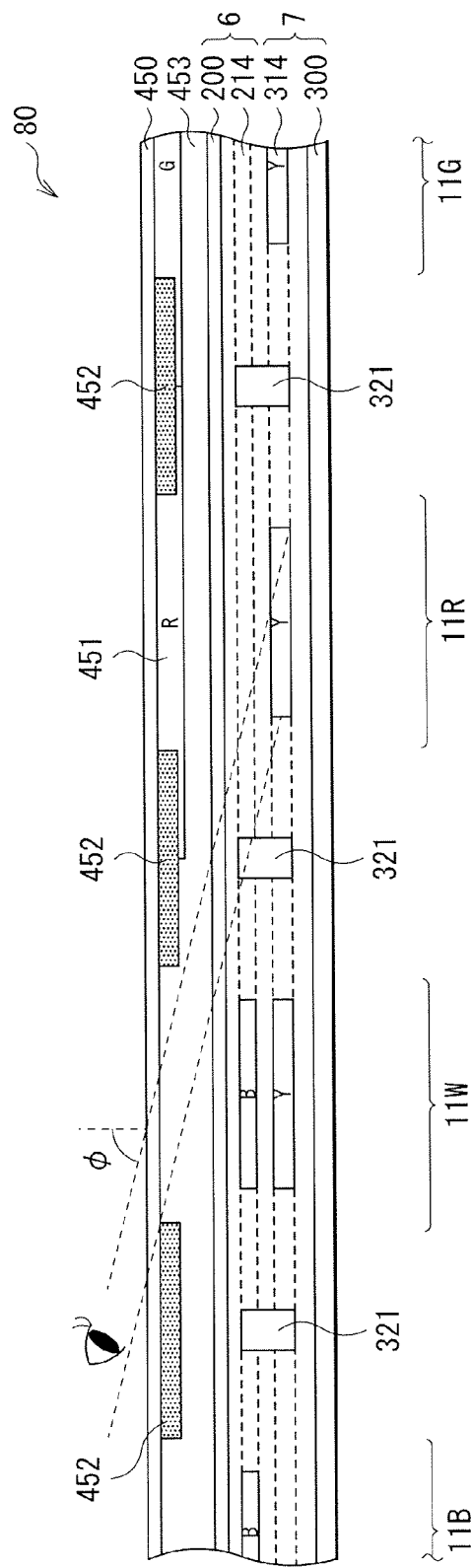
FIG. 30 is a schematic diagram illustrating an exemplary operation of the display section illustrated in FIG. 28.

FIG. 30 illustrates vision of light by a viewer when the viewer observes the display section 80 in a direction offset by an observation angle θ from the front of the display section 80. In the case where the viewer observes the display section 80 at the observation angle θ, a possibility of observation of optical color mixing due to the sub-pixels 11 adjacent to each other is also allowed to be reduced. Specifically, when the light-shielding sections 321 are not provided, for example, the viewer observes yellow light emitted by the yellow light emitting layer 314 of an adjacent sub-pixel 11R instead of white light emitted as synthesized light by the blue light emitting layer 214 and the yellow light emitting layer 314 of a sub-pixel 11W. Consequently, optical color mixing occurs. In contrast, in the display section 80, each light-shielding section 321 blocks the yellow light emitted by the yellow light emitting layer 314 of the adjacent sub-pixel 11R; hence, a possibility of occurrence of such optical color mixing is allowed to be reduced.

In this way, since the light-shielding section 321 shields light from the adjacent sub-pixel 11, the light-shielding section 321 preferably has a low light transmittance. Polyimide therefore is more preferable than acrylic resin as a material of the light-shielding section 321. Furthermore, novolac resin is more preferable than polyimide. In the case of using novolac resin, for example, a preferable baking condition may be as follows: oxygen atmosphere, 200° C. or higher, and 20 min or longer. Light transmittance is allowed to be reduced through such a baking condition.

As described above, in the third embodiment, the light-shielding sections are provided; hence, a possibility of occurrence of optical color mixing is allowed to be reduced.

Moreover, in the third embodiment, the cathode of the upper substrate and the cathode of the lower substrate are in contact with each other at an upper end of each light-shielding section; hence, impedance of each cathode is allowed to be decreased.

Moreover, in the third embodiment, since the light-shielding sections 321 partially enclose the light emitting region (the opening), the bonding material flows beyond the region of the sub-pixel; hence, reduction in bonding strength, etc. is allowed to be prevented.

Other effects are similar to those in the first embodiment.

[Modification 3-1]

Figure 31A:
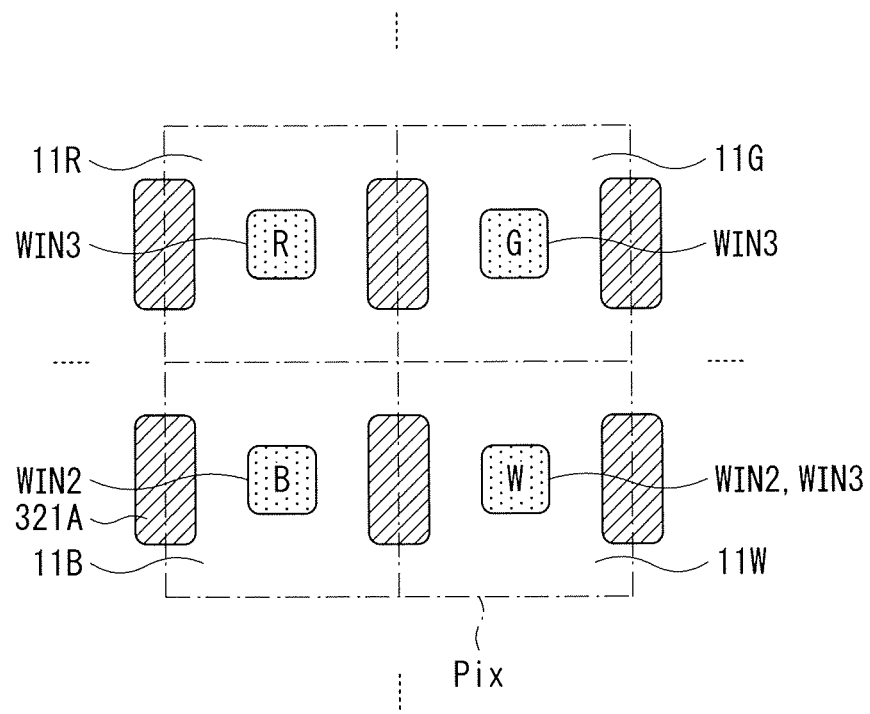
FIG. 31A is a plan diagram illustrating a layout of a light-shielding portion according to a modification of the third embodiment.
Figure 31B:
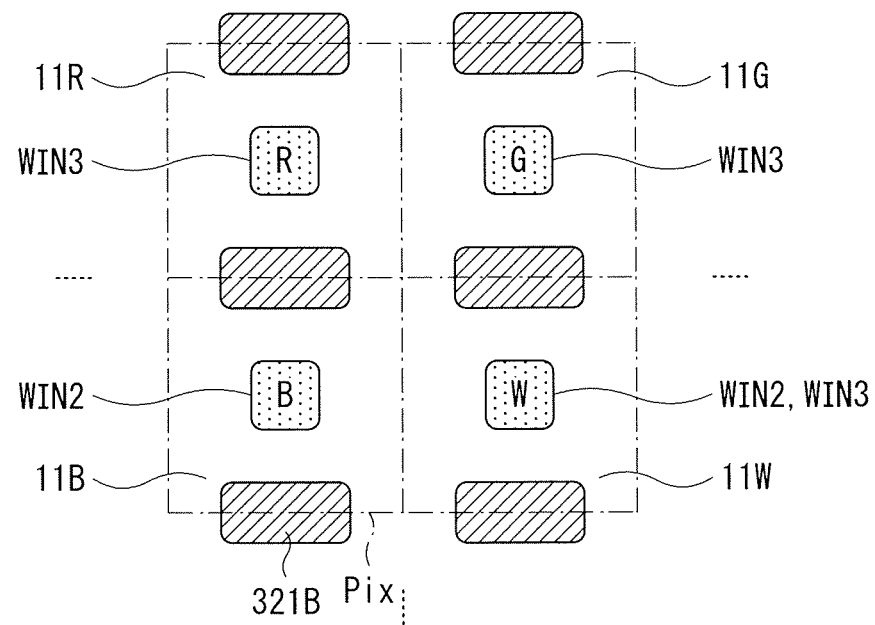
FIG. 31B is a plan diagram illustrating a layout of a light-shielding portion according to another modification of the third embodiment.

Although the light-shielding section 321 is provided in the neighborhood of a boundary of sub-pixels 11 adjacent to each other in a horizontal direction (lateral direction), and is provided in the neighborhood of a boundary of sub-pixels 11 adjacent to each other in a vertical direction (longitudinal direction) in the third embodiment, this is not limitative. Any other configuration may be used so long as the light-shielding sections partially enclose the light emitting region (the opening). For example, as illustrated in FIG. 31A, the light-shielding section 321A may be provided only in the neighborhood of a boundary of sub-pixels 11 adjacent to each other in a horizontal direction (lateral direction). Alternatively, as illustrated in FIG. 31B, the light-shielding section 321B may be provided only in the neighborhood of a boundary of sub-pixels 11 adjacent to each other in a vertical direction (longitudinal direction).

[Modification 3-2]

Figure 32:
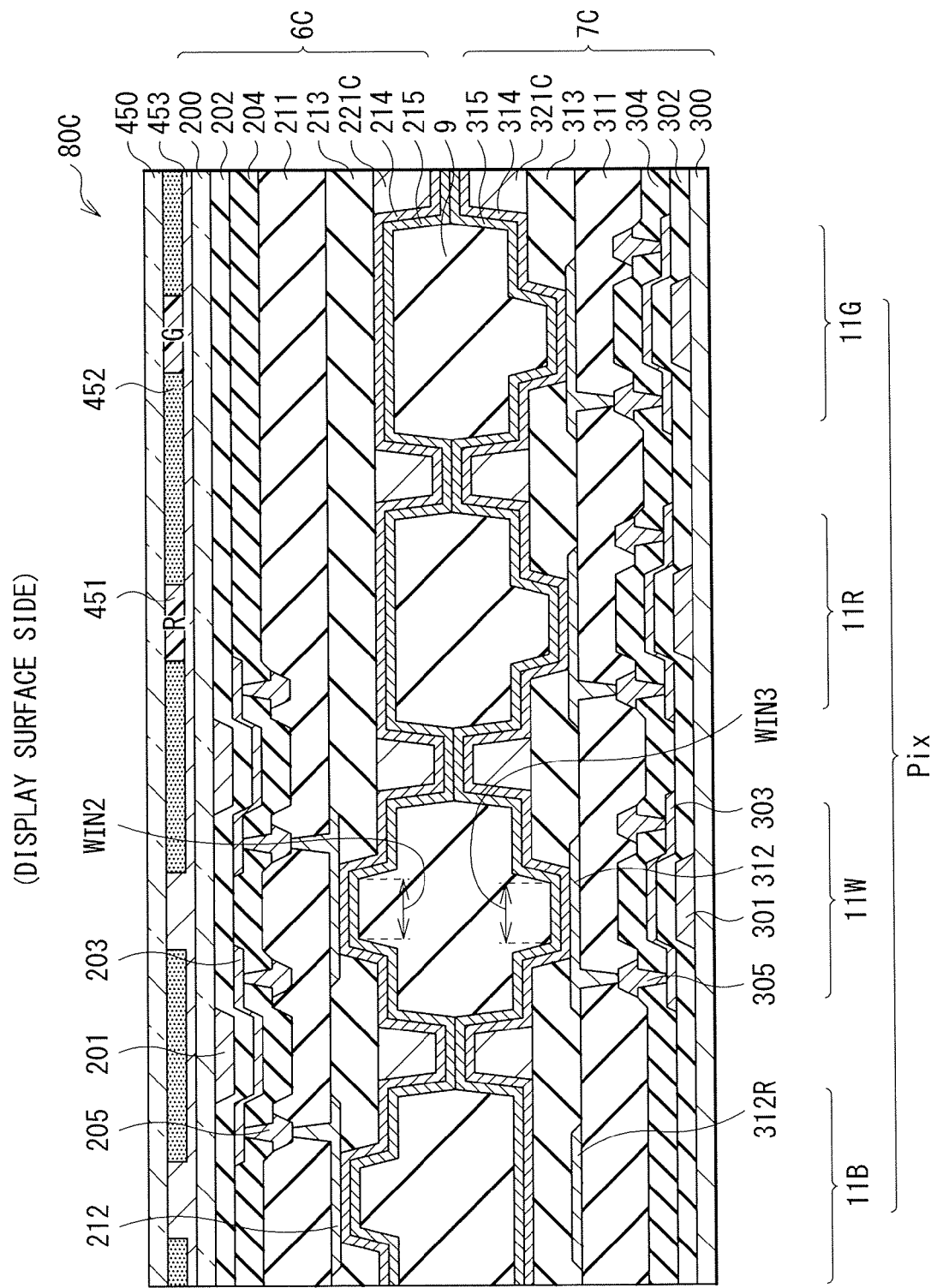
FIG. 32 is a sectional diagram illustrating an exemplary configuration of a display section according to another modification of the third embodiment.

Although the light-shielding sections 321 are provided in the lower substrate 7 in the third embodiment, this is not limitative. Alternatively, for example, the light-shielding sections 321 may be provided in the upper substrate 6. Alternatively, as with a display section 80C illustrated in FIG. 32, light-shielding sections 221C may be provided in an upper substrate 6C, and light-shielding sections 321C may be provided in a lower substrate 7C. The light-shielding section 221C may be formed of a material similar to that of the light-shielding section 321C.

Figure 33:
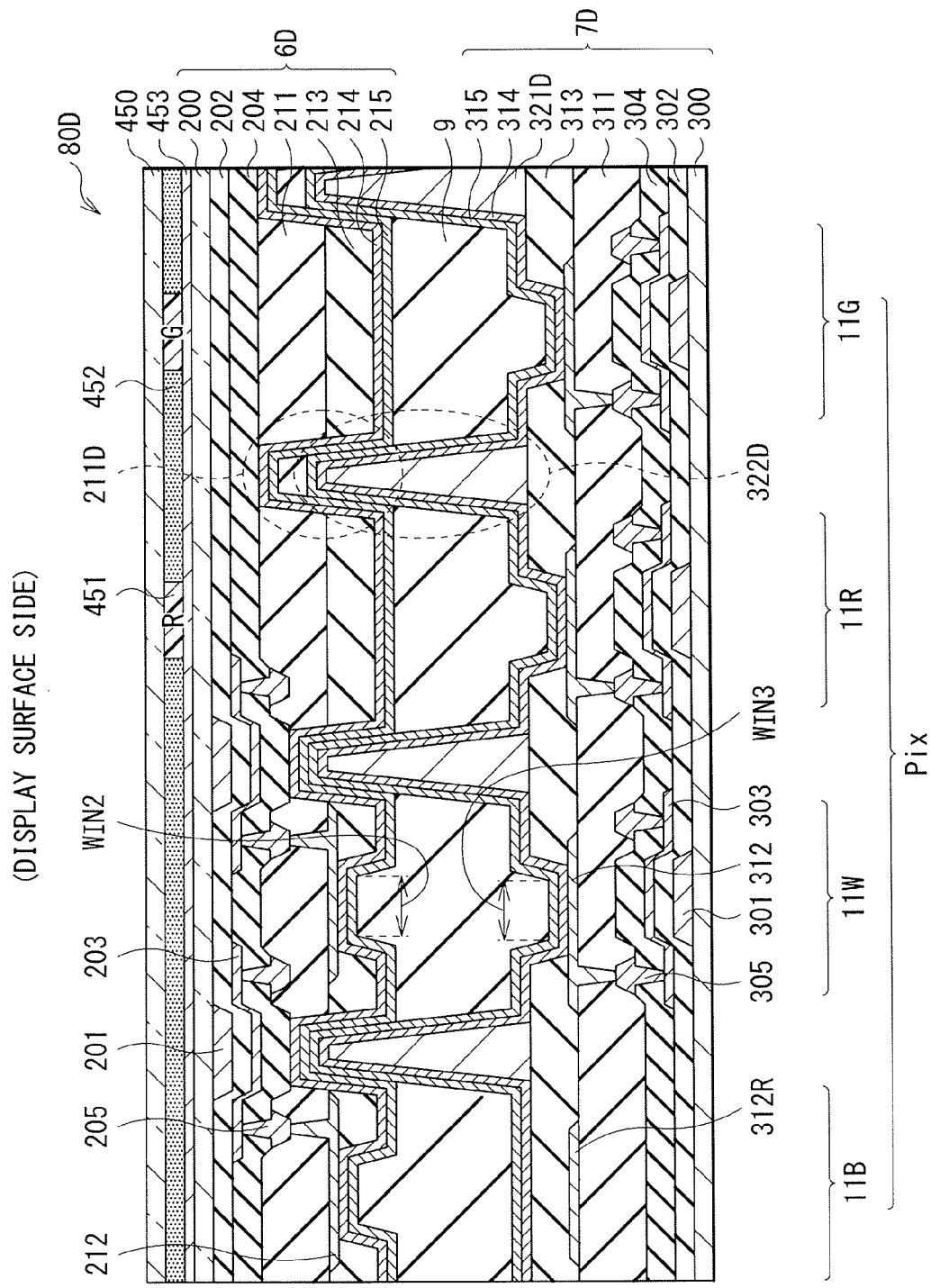
FIG. 33 is a sectional diagram illustrating an exemplary configuration of a display section according to another modification of the third embodiment.

Moreover, as with a display section 80D illustrated in FIG. 33, height of each light-shielding section 321D in a lower substrate 7D may be increased, and a depression portion 221D may be formed at a position corresponding to the light-shielding section 321D in an upper substrate 6D so that a projecting portion 322D is fit in the depression portion 221D. In this case, an upper end of the light-shielding section 321D is able to be more close to a display surface side; hence, a possibility of occurrence of optical color mixing is allowed to be further reduced.

[Modification 3-3]

Although the cathode 215 in the upper substrate 6 and the cathode 315 in the lower substrate 7 are in contact with each other at the upper end of each light-shielding section 321 in the third embodiment, this is not limitative. Alternatively, the cathodes 215 and 216 may be separated from each other without being in contact with each other. In this case, a possibility of occurrence of optical color mixing is also reduced.

4. Application Examples

Application examples of each of the display units described in the above-described embodiments and the modifications thereof are now described.

Figure 34:
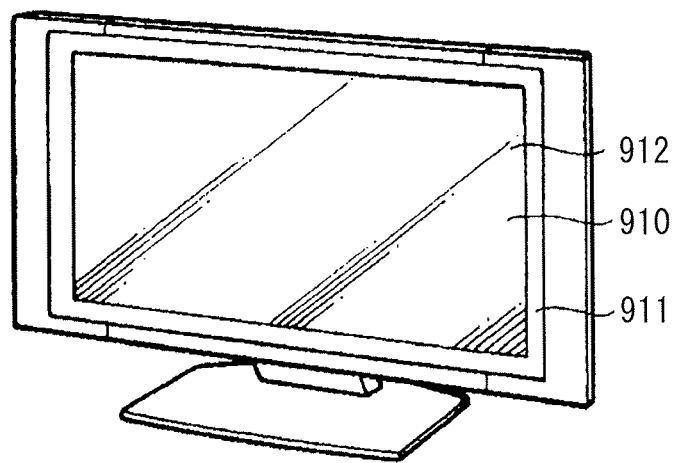
FIG. 34 is a perspective diagram illustrating an appearance configuration of a television unit to which the display unit according to any of the example embodiments and the modifications is applied.

FIG. 34 illustrates appearance of a television unit to which the display unit of any of the above-described embodiments and the modifications thereof is applied. The television unit has, for example, an image display screen section 910 including a front panel 911 and filter glass 912. The image display screen section 910 is configured of the display unit according to any of the above-described embodiments and the modifications thereof.

The display unit according to any of the above-described embodiments and the modifications thereof is applicable to an electronic apparatus in any field. In addition to the television unit, examples of the electronic apparatus may include a digital camera, a notebook personal computer, a mobile terminal unit such as a mobile phone, a portable video game player, and a video camera. In other words, the display unit according to any of the above-described embodiments and the modifications thereof is applicable to an electronic apparatus that displays images in any field.

Although the present application has been described with the example embodiments, the modifications thereof, and the application examples hereinbefore, the present application is not limited thereto, and various modifications or alterations thereof may be made.

For example, the above-described embodiments and the modifications thereof may be combined with one another. Specifically, the configuration according to the first embodiment or one of the modifications thereof may be combined with the configuration according to the second embodiment. Such a combination may be further combined with the configuration according to the third embodiment.

Moreover, for example, although the display section is configured of the two substrates (the upper substrate and the lower substrate) in the above-described embodiments and the modifications thereof, this is not limitative. Alternatively, for example, the display section may be configured of three substrates (a first substrate, a second substrate, and a third substrate). In this case, for example, the display section is allowed to be configured such that the first substrate includes a red light emitting layer, the second substrate includes a green light emitting layer, and a third substrate includes a blue light emitting layer.

Moreover, for example, although the pixel circuit 12 has a configuration of so-called "2Tr1C" in the above-described embodiments and the modifications thereof, this is not limitative. Alternatively, for example, the pixel circuit 12 may have a configuration of so-called "2Tr2C" in which a capacitive element is provided parallel to the light emitting element 30 in FIG. 3. Alternatively, the pixel circuit 12 may have a configuration of so-called "3Tr1C" in which a control transistor is provided on a path of a drive current, which flows from the power line PL to the light emitting element 30 via the drive transistor DRTr, in order to control ON and OFF of the drive current.

Moreover, for example, although the write transistor WSTr and the drive transistor DRTr are each configured of NMOS in the above-described embodiments and the modifications thereof, this is not limitative. Alternatively, one or both of such transistors may be configured of PMOS.

Moreover, for example, a circuit and/or a sensor other than the pixel circuit 12 may be provided in the upper substrate in any of the above-described embodiments and the modifications thereof. Specifically, for example, since the number of pixel circuits 12 provided in the upper substrate 2 is smaller than the number of pixel circuits 12 provided in the lower substrate 3 as illustrated in FIG. 2, an empty space may be formed in the upper substrate 2. For example, a light sensor and a control circuit thereof may be provided using such an empty space. Specifically, a light sensor that measures temporal variation of luminance of light emitted from an organic EL device, a light sensor for an optical touch panel, etc. may be provided.

Moreover, for example, although the display unit includes the organic EL display device in the above-described embodiments and the modifications thereof, the display unit is not limited thereto. Any type of display units may be used so long as the display unit includes a current-drive display device.

Furthermore, the technology encompasses any possible combination of some or all of the various embodiments described herein and incorporated herein.

It is possible to achieve at least the following configurations from the above-described example embodiments of the disclosure.

(1) A display unit, including
a plurality of display function layers provided in a stacking direction, and each including a plurality of pixel circuits,
wherein a pixel circuit group configured by predetermined number of the pixel circuits configures a single display pixel, and the predetermined number of the pixel circuits spans the plurality of display function layers.

(2) The display unit according to (1), wherein the plurality of display function layers are a first display function layer and a second display function layer, the first display function layer being disposed on a display surface side, and a second display function layer being disposed on a side opposite to the display surface side.

(3) The display unit according to (2), wherein
the first display function layer includes a first light emitting layer that emits light of a basic color, and
the second display function layer includes a second light emitting layer that emits light of a complementary color of the basic color.

(4) The display unit according to (2), wherein
the first display function layer includes a first light emitting layer,
the second display function layer includes a second light emitting layer that emits light of a basic color, and
the first light emitting layer emits light of a complementary color of the basic color.

(5) The display unit according to (3) or (4), wherein
the first display function layer further includes
a first transistor layer,
a first anode provided between the first light emitting layer and the first transistor layer and disposed for each of the pixel circuits, and
a first cathode disposed on a side, of the first light emitting layer, opposite to the first transistor layer, and
the second display function layer further includes
a second transistor layer,
a second anode provided between the second light emitting layer and the second transistor layer and disposed for each of the pixel circuits, and
a second cathode disposed on a side, of the second light emitting layer, opposite to the second transistor layer.

(6) The display unit according to (5), wherein
the first transistor layer is disposed on the display surface side of the first light emitting layer in the first display function layer, and
the second transistor layer is disposed on a side opposite to the display surface side of the second light emitting layer in the second display function layer.

(7) The display unit according to (6), further including a conductive layer provided between the first cathode and the second cathode, the conductive layer electrically conducting the first cathode to the second cathode.

(8) The display unit according to (6), further including an insulating layer provided between the first cathode and the second cathode.
(9) The display unit according to (6) or (7), wherein one or both of the first cathode and the second cathode includes a plurality of projecting portions each projecting from one of the first cathode and the second cathode to the other of the first cathode and the second cathode.
(10) The display unit according to (6) or (7), wherein
one of the first cathode and the second cathode includes a plurality of projecting portions each projecting to the other of the first cathode and the second cathode, and
the other of the first cathode and the second cathode includes a plurality of depression portions fitted with the respective projecting portions.
(11) The display unit according to (9) or (10), wherein the first cathode and the second cathode are in contact with each other by the projecting portions.
(12) The display unit according to any one of (9) to (11), wherein the projecting portions are provided to partially enclose a first light emitting region corresponding to each of the first anodes, or enclose a second light emitting region corresponding to each of the second anodes.
(13) The display unit according to any one of (5) to (12), wherein a second light emitting region corresponding to each of the second anodes is smaller than a first light emitting region corresponding to each of the first anodes.
(14) The display unit according to any one of (2) to (13), wherein
the first display function layer includes one or more first pixel circuits configuring part of the pixel circuit group,
the second display function layer includes a plurality of second pixel circuits configuring rest of the pixel circuit group,
the first display function layer includes a first scan line and a first power line connected to the one or more first pixel circuits,
the second display function layer includes a second scan line and a second power line connected to the plurality of second pixel circuits,
the first scan line is connected to the second scan line, and
the first power line is connected to the second power line.
(15) The display unit according to (14), further including:
a scan line drive section provided in one of the first display function layer and the second display function layer, and configured to drive the first scan line and the second scan line; and
a power line drive section provided in the other of the first display function layer and the second display function layer, and configured to drive the first power line and the second power line.
(16) The display unit according to any one of (2) to (15), wherein
the display pixel includes sub-pixels for each of basic colors of light, and
each of the sub-pixels includes a light emitting region in one of the first display function layer and the second display function layer.
(17) The display unit according to any one of (2) to (16), wherein one or both of the first display function layer and the second display function layer includes a color filter.
(18) The display unit according to any one of (1) to (16), further including a color filter layer provided as a layer different from the first display function layer and the second display function layer.

(19) A display drive method, including:
preparing a first display function layer and a second display function layer, the first display function layer including a plurality of pixel circuits, and the second display function layer including a plurality of pixel circuits and being disposed in a stacking direction of the first display function layer; and
performing scanning of a plurality of display pixels on a pixel line basis, each of the display pixels including one or more first pixel circuits in the plurality of pixel circuits provided in the first display function layer and a plurality of second pixel circuits in the plurality of pixel circuits provided in the second display function layer.
(20) The display drive method according to (19), wherein
a scan signal is supplied to the one or more first pixel circuits via a first scan line, and the scan signal is supplied to the plurality of second pixel circuits via a second scan line connected to the first scan line, and
a drive signal is supplied to the one or more first pixel circuits via a first power line, and the drive signal is supplied to the plurality of second pixel circuits via a second power line connected to the first power line.
(21) A method of manufacturing a display unit, the method including:
fabricating a plurality of display function layers each including a plurality of pixel circuits; and
overlaying the plurality of display function layers on one another to allow a pixel circuit group configured by predetermined number of the pixel circuits to configure a single display pixel, the predetermined number of the pixel circuits spanning the plurality of display function layers.
(22) An electronic apparatus provided with a display unit and a control section configured to perform operation control on the display unit, the display unit including
a plurality of display function layers provided in a stacking direction, and each including a plurality of pixel circuits,
wherein a pixel circuit group configured by predetermined number of the pixel circuits configures a single display pixel, and the predetermined number of the pixel circuits spans the plurality of display function layers.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A display unit, comprising
a plurality of display function layers provided in a stacking direction, and each including a plurality of pixel circuits,
wherein a pixel circuit group including predetermined number of the pixel circuits provides a single display pixel, and the predetermined number of the pixel circuits are associated with the plurality of display function layers,
wherein the plurality of display function layers includes a first display function layer and a second display function layer, the first display function layer being provided on a display surface side, and the second display function layer being provided on a side opposite to the display surface side,
wherein the first display function layer includes a first light emitting layer that emits light of a color, and the second display function layer includes a second light emitting layer that emits light of a complementary color of the color, wherein the first display function layer further includes
- a first transistor layer,
- a first anode provided between the first light emitting layer and the first transistor layer and provided for each of the pixel circuits, and
- a first cathode disposed on a side, of the first light emitting layer, opposite to the first transistor layer, and the second display function layer further includes
- a second transistor layer,
- a second anode provided between the second light emitting layer and the second transistor layer and provided for each of the pixel circuits, and
- a second cathode disposed on a side, of the second light emitting layer, opposite to the second transistor layer, wherein the first transistor layer is provided on the display surface side of the first light emitting layer in the first display function layer, and the second transistor layer is provided on a side opposite to the display surface side of the second light emitting layer in the second display function layer, and wherein a conductive layer is further provided between the first cathode and the second cathode, and the conductive layer electrically conducting the first cathode to the second cathode.

2. The display unit according to claim 1, wherein one or both of the first cathode and the second cathode includes a plurality of projecting portions each projecting from one of the first cathode and the second cathode to the other of the first cathode and the second cathode.

3. The display unit according to claim 2, wherein the first cathode and the second cathode are in contact with each other by the projecting portions.

4. The display unit according to claim 2, wherein the projecting portions are provided to partially enclose a first light emitting region corresponding to each of the first anodes, or enclose a second light emitting region corresponding to each of the second anodes.

5. The display unit according to claim 1, wherein
one of the first cathode and the second cathode includes a plurality of projecting portions each projecting to the other of the first cathode and the second cathode, and
the other of the first cathode and the second cathode includes a plurality of depression portions fitted with the respective projecting portions.

6. The display unit according to claim 1, wherein a second light emitting region corresponding to each of the second anodes is smaller than a first light emitting region corresponding to each of the first anodes.

7. The display unit according to claim 1, wherein
the first display function layer includes one or more first pixel circuits configuring part of the pixel circuit group,
the second display function layer includes a plurality of second pixel circuits configuring rest of the pixel circuit group,
the first display function layer includes a first scan line and a first power line connected to the one or more first pixel circuits,
the second display function layer includes a second scan line and a second power line connected to the plurality of second pixel circuits,
the first scan line is connected to the second scan line, and
the first power line is connected to the second power line.

8. The display unit according to claim 7, further comprising:
a scan line drive section provided in one of the first display function layer and the second display function layer, and configured to drive the first scan line and the second scan line; and
a power line drive section provided in the other of the first display function layer and the second display function layer, and configured to drive the first power line and the second power line.

9. The display unit according to claim 1, wherein
the display pixel includes sub-pixels, and
each of the sub-pixels includes a light emitting region in one of the first display function layer and the second display function layer.

10. The display unit according to claim 1, further comprising a color filter layer provided as a layer different from the first display function layer and the second display function layer.

11. An electronic apparatus provided with a display unit and a control section configured to perform operation control on the display unit, the display unit comprising:
a plurality of display function layers provided in a stacking direction, and each including a plurality of pixel circuits,
wherein a pixel circuit group including predetermined number of the pixel circuits provides a single display pixel, and the predetermined number of the pixel circuits are associated with the plurality of display function layers
wherein the plurality of display function layers includes a first display function layer and a second display function layer, the first display function layer being provided on a display surface side, and the second display function layer being provided on a side opposite to the display surface side,
wherein the first display function layer includes a first light emitting layer that emits light of a color, and the second display function layer includes a second light emitting layer that emits light of a complementary color of the color,
wherein the first display function layer further includes
- a first transistor layer,
- a first anode provided between the first light emitting layer and the first transistor layer and provided for each of the pixel circuits, and
- a first cathode provided on a side, of the first light emitting layer, opposite to the first transistor layer, and the second display function layer further includes
- a second transistor layer,
- a second anode provided between the second light emitting layer and the second transistor layer and provided for each of the pixel circuits, and
- a second cathode disposed on a side, of the second light emitting layer, opposite to the second transistor layer, wherein the first transistor layer is provided on the display surface side of the first light emitting layer in the first display function layer, and the second transistor layer is provided on a side opposite to the display surface side of the second light emitting layer in the second display function layer, and wherein a conductive layer is further provided between the first cathode and the second cathode, and the conductive layer electrically conducting the first cathode to the second cathode.

12. A display unit, comprising
a plurality of display function layers provided in a stacking direction, and
a pixel circuit group includes a number of the pixel circuits,
wherein the plurality of display function layers includes a first display function layer and a second display function layer, the first display function layer being provided on a display surface side, and the second display function layer being provided on a side opposite to the display surface side,
wherein the first display function layer includes a first light emitting layer that emits light of a color, and the second display function layer includes a second light emitting layer that emits light of a complementary color of the color,
wherein the first display function layer further includes
a first transistor layer,
a first anode provided between the first light emitting layer and the first transistor layer, and
a first cathode disposed on a side, of the first light emitting layer, opposite to the first transistor layer, and
the second display function layer further includes
a second transistor layer,
a second anode provided between the second light emitting layer and the second transistor layer, and
a second cathode provided on a side, of the second light emitting layer, opposite to the second transistor layer,
wherein the first transistor layer is provided on the display surface side of the first light emitting layer in the first display function layer, and the second transistor layer is provided on a side opposite to the display surface side of the second light emitting layer in the second display function layer, and
wherein at least one of the first cathode and the second cathode includes a plurality of projecting portions each projecting from one of the first cathode and the second cathode to the other of the first cathode and the second cathode.

13. The display unit according to claim 12, wherein the first cathode and the second cathode are in contact with each other by the projecting portions.

14. The display unit according to claim 12, wherein the projecting portions are provided to partially enclose a first light emitting region corresponding to each of the first anodes, or enclose a second light emitting region corresponding to each of the second anodes.

15. A display unit, comprising
a plurality of display function layers provided in a stacking direction, and
a pixel circuit group includes a number of the pixel circuits,
wherein the plurality of display function layers includes a first display function layer and a second display function layer, the first display function layer being provided on a display surface side, and the second display function layer being provided on a side opposite to the display surface side,
wherein the first display function layer includes a first light emitting layer that emits light of a color, and the second display function layer includes a second light emitting layer that emits light of a complementary color of the color,
wherein the first display function layer further includes
a first transistor layer,
a first anode provided between the first light emitting layer and the first transistor layer, and
a first cathode disposed on a side, of the first light emitting layer, opposite to the first transistor layer, and
the second display function layer further includes
a second transistor layer,
a second anode provided between the second light emitting layer and the second transistor layer, and
a second cathode provided on a side, of the second light emitting layer, opposite to the second transistor layer,
wherein the first transistor layer is provided on the display surface side of the first light emitting layer in the first display function layer, and the second transistor layer is provided on a side opposite to the display surface side of the second light emitting layer in the second display function layer, and
wherein one of the first cathode and the second cathode includes a plurality of projecting portions each projecting to the other of the first cathode and the second cathode, and the other of the first cathode and the second cathode includes a plurality of depression portions fitted with the respective projecting portions.

* * * * *